(12) United States Patent
Ito et al.

(10) Patent No.: US 9,805,962 B2
(45) Date of Patent: Oct. 31, 2017

(54) SUBSTRATE CONVEYANCE METHOD, AND SUBSTRATE CONVEYANCE DEVICE

(71) Applicant: TOKYO ELECTRON LIMITED, Tokyo (JP)

(72) Inventors: Nobuaki Ito, Miyagi (JP); Hiroki Oka, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 546 days.

(21) Appl. No.: 14/400,739

(22) PCT Filed: Jun. 5, 2013

(86) PCT No.: PCT/JP2013/065542
§ 371 (c)(1),
(2) Date: Nov. 12, 2014

(87) PCT Pub. No.: WO2013/187290
PCT Pub. Date: Dec. 19, 2013

(65) Prior Publication Data
US 2015/0139758 A1    May 21, 2015

Related U.S. Application Data

(60) Provisional application No. 61/663,041, filed on Jun. 22, 2012.

(30) Foreign Application Priority Data

Jun. 12, 2012 (JP) .................................. 2012-133021

(51) Int. Cl.
*H01L 21/677* (2006.01)

(52) U.S. Cl.
CPC .... *H01L 21/67745* (2013.01); *H01L 21/6776* (2013.01)

(58) Field of Classification Search
None
See application file for complete search history.

(56) References Cited

U.S. PATENT DOCUMENTS

2001/0047225 A1* 11/2001 Shimoike ......... G05B 19/41815
700/250
2007/0000612 A1* 1/2007 Nozawa ............ H01L 21/67167
156/345.32

(Continued)

FOREIGN PATENT DOCUMENTS

JP  2010-245127 A  10/2010
JP  2010-251507 A  11/2010

OTHER PUBLICATIONS

International Search Report dated Jul. 9, 2013 in PCT/JP2013/065542.

*Primary Examiner* — Tuan Dao
(74) *Attorney, Agent, or Firm* — Rothwell, Figg, Ernst & Manbeck, P.C.

(57) ABSTRACT

The purpose of the present invention is to accurately deal with a variety of processing conditions and variations thereof, and to improve total throughput by efficiently operating a conveyance arm device in accordance with the processing conditions, even during cleaning. When a first wafer is loaded on a load-lock chamber, a conveyance-sequence category for operating each of a number of steps for a conveyance arm device capable of operating during cleaning is selected in accordance with processing conditions of the wafer, and a plurality of operation patterns are selected, combined and scheduled. The conveyance arm device is controlled in accordance with the scheduled conveyance sequence to control substrate conveyance.

7 Claims, 17 Drawing Sheets

(56) References Cited

U.S. PATENT DOCUMENTS

| 2008/0019809 A1* | 1/2008 | Takano | H01L 21/67745 414/222.01 |
| 2009/0016860 A1* | 1/2009 | Kaneko | H01L 21/67745 414/222.11 |
| 2011/0178626 A1* | 7/2011 | Kondoh | B25J 19/00 700/108 |

* cited by examiner

FIG.5

| | FIRST CONVEYANCE SEQUENCE S1 | SECOND CONVEYANCE SEQUENCE S2 | THIRD CONVEYANCE SEQUENCE S3 |
|---|---|---|---|
| FIRST RATE-CONTROLLING PATTERN | $Tin \times 2 + Tout \times 2 + Tbf + Taf$ | SAME AS LEFT | SAME AS LEFT |
| SECOND RATE-CONTROLLING PATTERN | $Tc + Tin + Tout$ | $(Tc \times 2 + Tin \times 2 + Tout \times 2 + Tbf + Taf) \div 3$ | $(Tc + Tin + Tout) \div 2$ |
| THIRD RATE-CONTROLLING PATTERN | $(Tp + Tc + Tin + Tout) \div n$ | SAME AS LEFT | SAME AS LEFT |
| FOURTH RATE-CONTROLLING PATTERN | $(Tp + Tin \times 2 + Tout \times 2 + Tbf + Taf) \div n$ | $(Tp + Tin \times 3 + Tout \times 3 + Tbf + Taf) \div n$ | $(Tp + Tin \times 4 + Tout \times 4 + Tbf \times 2 + Taf \times 2) \div n$ |

SUBSTRATE CONVEYANCE METHOD, AND SUBSTRATE CONVEYANCE DEVICE

CROSS REFERENCE TO RELATED APPLICATION

This application is a 35 U.S.C. 371 National Phase Entry Application from PCT/JP2013/065542, filed Jun. 5, 2013, which claims priority to and the benefit of U.S. Provisional Application No. 61/663,041, filed Jun. 22, 2012 and Japanese Patent Application No. 2012-133021, filed Jun. 12, 2012, the disclosures of which are incorporated herein in their entirety by reference.

TECHNICAL FIELD

The present disclosure relates to a substrate conveyance method and a substrate conveyance device in which a substrate is conveyed to a plurality of processing chambers which in which a substrate process processing is performed, using a conveyance arm device.

BACKGROUND

This type of a substrate conveyance device carries substrates such as, for example, semiconductors wafer into a plurality of processing chambers by a conveyance arm device so as to perform process processings such as etching and film forming in parallel, thereby improving a throughput.

In such a substrate conveyance device, when a wafer process processing is terminated, a cleaning processing may be performed, for example, by generating plasma in a processing chamber after a processed wafer is carried out from the processing chamber, in order to maintain a condition within the processing chamber by properly removing, for example, a reaction product.

However, when the substrate conveyance device is caused to wait while holding an unprocessed wafer since a next wafer cannot be carried into the processing chamber where the cleaning processing is being performed, the throughput is degraded. In connection with this point, Patent Document 1 discloses a conveyance device in which a predetermined operation of the conveyance device is executed such that the conveyance device is operated even during the cleaning of a processing chamber to perform carry-out/in in relation to the load-lock chamber, thereby causing the conveyance device to exhibit the original throughput of the conveyance device.

PRIOR ART DOCUMENT

Patent Document

Patent Document 1: Japanese Patent Laid-Open Publication No. 2010-245127

SUMMARY OF THE INVENTION

Problem to be Solved

However, when the operations of the conveyance device are determined in advance as in Patent Document 1, it may be difficult to deal with various processing conditions such as, for example, various process processing times, cleaning processing times, and substrate carry-out/in times. In addition, when a processing condition is changed, for example, when switching to a wafer processing of a different processing condition is performed or when an operation time is corrected according to a processing result of a process processing, the throughput may not be maintained. Even in such a case, when the operations of the conveyance device are determined in advance as in Patent Document 1, for example, a wafer W to be carried out since a process is terminated may not be carried out at that timing. As a result, an unnecessary waiting time may be caused so that a throughput may be degraded.

Accordingly, the present disclosure has been made in consideration of the above-described problems, and an object of the present disclosure is to provide a substrate conveyance method and a substrate conveyance device which may accurately deal with various processing conditions and variations thereof and improve a total through put by efficiently operating a conveyance arm device according to the processing conditions.

Means to Solve the Problem

In order to solve the above-described problems, according to an aspect of the present disclosure, there is provided a substrate conveyance method of a substrate conveyance device which is provided with a plurality of processing chambers, in each of which a process processing performed by carrying a substrate therein and a cleaning processing performed after the process processing by carrying out the substrate therefrom are repeatedly executed, a load-lock chamber configured to load or unload the substrate, and a conveyance arm device configured to perform carry-out/in between each processing chamber and the load-lock chamber. The substrate conveyance device includes a storage unit configured to store conveyance-sequence categories which operate the conveyance arm device configured to be operated during the cleaning processing per a number of steps of the conveyance arm device, the storage unit being configured to store a plurality of operation patterns of the conveyance arm device in association with each of the conveyance-sequence categories. The substrate conveyance method includes: selecting a conveyance-sequence category among the conveyance-sequence categories based on a processing condition including a process processing time, a cleaning processing time and a substrate carry-out/in time of a first substrate when the first substrate is loaded in the load-lock chamber when a plurality of substrates are processed in parallel by the plurality of processing chambers, respectively; scheduling a conveyance sequence by selecting operation patterns associated with the selected conveyance category among the plurality of operation patterns of the conveyance arm device which are stored in the storage unit, and combining the selected operation patterns in such a manner of selecting a next pattern according to a conveyance state estimated from an operation pattern configured immediately before the next operation pattern; and controlling the conveyance arm device according to the scheduled conveyance sequence to perform a conveyance control of the substrate.

In order to solve the above-described problems, according to another aspect of the present disclosure, there is provided a substrate conveyance device including: a plurality of processing chambers, in each of which a process processing performed by carrying a substrate therein and a cleaning processing performed after the process processing by carrying out the substrate therefrom are repeatedly executed; a load-lock chamber configured to load or unload the substrate; a conveyance arm device configured to perform carry-out/in between each processing chamber and the load-lock chamber; a storage unit configured to store conveyance-sequence categories which operate the conveyance arm device configured to be operated during the cleaning processing per a number of steps of the conveyance arm device, the storage unit being configured to store a plurality of operation patterns of the conveyance arm device in association with each of the conveyance-sequence categories; and a control unit configured to execute processes of: selecting a conveyance-sequence category among the conveyance-sequence categories based on a processing condition including a process processing time, a cleaning processing time and a substrate carry-out/in time of a first substrate when the first substrate is loaded in the load-lock chamber when a plurality of substrates are processed in parallel by the plurality of processing chambers, respectively; scheduling a conveyance sequence by selecting operation patterns associated with the selected conveyance category among the plurality of operation patterns of the conveyance arm device which are stored in the storage unit, and combining the selected operation patterns in such a manner of selecting a next pattern according to a conveyance state estimated from an operation pattern configured immediately before the next operation pattern; and controlling the conveyance arm device according to the scheduled conveyance sequence to perform a conveyance control of the substrate.

According to the present disclosure described above, a conveyance sequence is scheduled by selecting the conveyance-sequence category according to the number of steps of operating the conveyance arm device during the cleaning of the processing chambers, selecting and configuring the operation patterns according to the processing condition, and combining the operation patterns in such a manner of selecting a next operation pattern is selected according to a conveyance state estimated from an operation pattern immediately before the next operation. As a result, it is also possible to deal with various processing conditions by an optimum combination of operation patterns, and the conveyance arm device may be efficiently operated even during cleaning according to the processing conditions so that the total substrate processing throughput can be improved.

In addition, the conveyance-sequence catteries are selected and scheduled according to substrate processing conditions at the timing when the first substrate is carried into the load-lock chamber. For example, when a first substrate of which the processing condition is varied is carried into the load-lock chamber, the conveyance-sequence category is selected and scheduled at that timing according to the processing conditions of the substrate.

In addition, in selecting the conveyance-sequence category, a conveyance-sequence category, which causes an operation time required per one substrate to be shortest when the plurality of substrates are processed in the plurality of processing chambers, may be selected based on a combination of operating times including the process processing time of the substrate, the cleaning processing time of a processing chamber, the carry-out/in time in the process processing time, and the carry-out/in time during the cleaning processing time.

The scheduling of the conveyance sequence may be divided into a first step, a second step, and a third step. In the first step, a predetermined substrate arrangement pattern required for configuring a regular conveyance sequence may be configured and taken as an initial state, and in the second and third steps, the operation patterns, of which the number is equal to the number of processing chambers in which parallel processings are performed, may be combined and taken as one cycle, and the conveyance sequence may be configured to repeat the one cycle.

In addition, in performing the substrate conveyance control based on the scheduled conveyance sequence, the substrate conveyance processing may be performed while controlling the conveyance arm device in the order of the scheduled first step, second step and third step, and in the third step, the operation patterns for the one cycle may be repeated.

In addition, in performing the substrate conveyance control based on the scheduled conveyance sequence, it may be determined whether the conveyance sequence is in a state where a conveyance efficiency is degraded in each step, and when it is determined that the conveyance sequence is in the state, a conveyance-sequence category may be selected again and scheduling may be performed again.

Further, in performing the substrate conveyance control based on the scheduled conveyance sequence, when switching to a substrate processing in which an operation including the process processing time and an operation time is varied is performed, a conveyance-sequence category may be selected again and scheduling may be performed again when a first substrate of the switching is loaded in the load-lock chamber.

Effect of the Invention

According to the present disclosure, it is possible to accurately deal with various processing conditions and variations thereof, and to improve total throughput by efficiently operating a conveyance arm device according to the processing conditions.

BRIEF DESCRIPTION OF DRAWINGS

FIGS. 2A to 2E are explanatory views of actions for describing a conveyance-sequence category in the exemplary embodiment, in which FIGS. 2A to 2E illustrate a specific example of a first conveyance sequence S1 that executes two steps c and d during a cleaning processing.

FIGS. 3A to 3G are explanatory views of actions for describing a conveyance-sequence category in the exemplary embodiment, in which FIGS. 3A to 3G illustrate a specific example of a second conveyance S2 that executes four steps c to f during a cleaning processing.

FIGS. 4A to 4I are explanatory views of actions for describing a conveyance-sequence category in the exemplary embodiment, in which FIGS. 4A to 4I illustrate a specific example of a third conveyance sequence S3 that executes six steps c to h during a cleaning processing.

FIG. 5 is a view illustrating a table in which calculation equations used for selecting the conveyance sequences S1, S2, and S3 are organized.

DETAILED DESCRIPTION TO EXECUTE THE INVENTION

Hereinafter, exemplary embodiments of the present disclosure will be described in detail with reference to the accompanying drawings. In the specification and drawings, the constituent elements having substantially same functions and configurations will be denoted by the same symbols and redundant descriptions thereof will be omitted.

(Exemplary Configuration of Substrate Conveyance Device)

Figure 1:
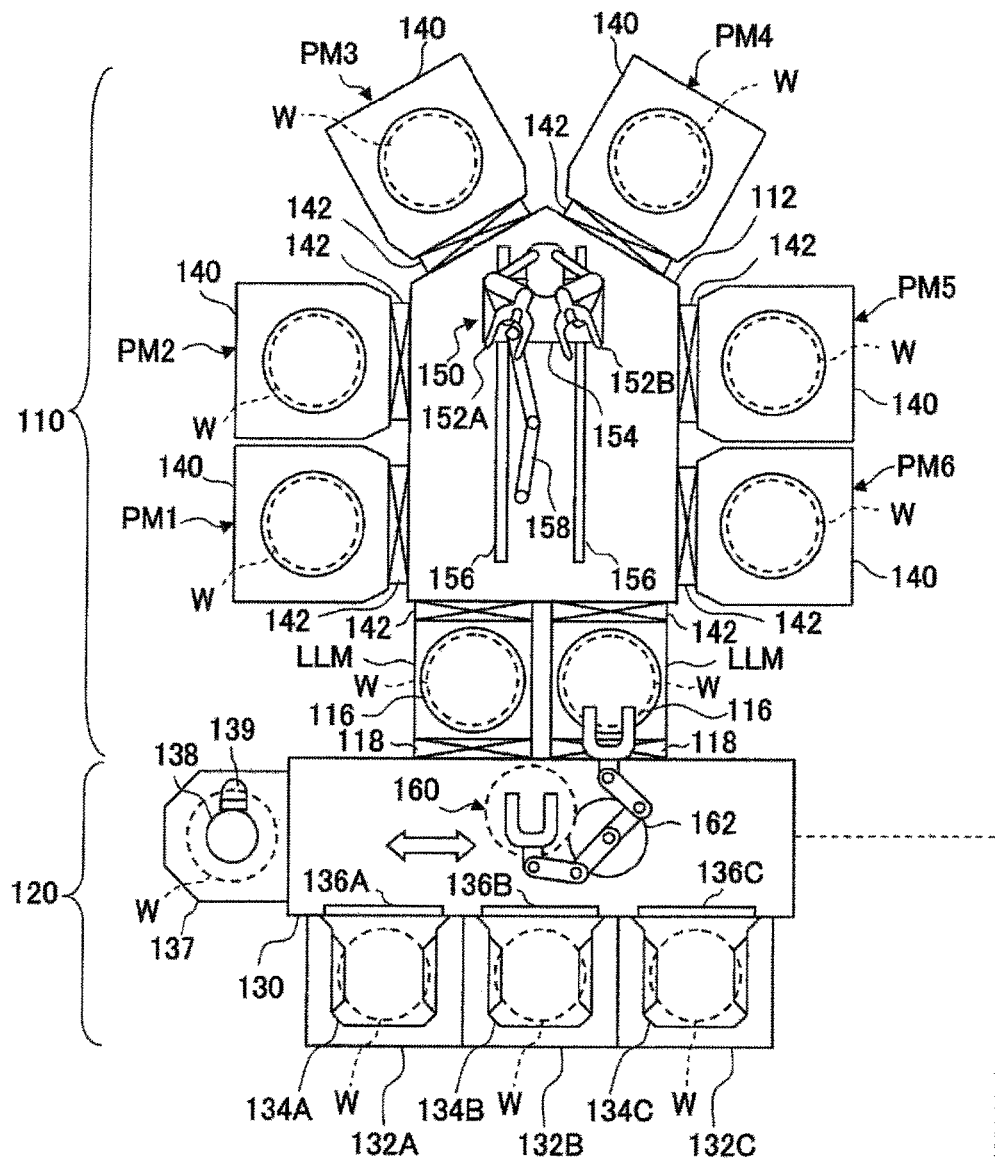
FIG. 1 is a cross-sectional view illustrating an exemplary configuration of a substrate conveyance device according to a first exemplary embodiment of the present disclosure.

First, descriptions will be made on a substrate conveyance device which may perform a substrate conveyance method according to an exemplary embodiment of the present disclosure with reference to the drawings. FIG. 1 is a cross-sectional view illustrating a schematic configuration of a substrate conveyance device. The substrate conveyance device (substrate processing device) 100 is provided with a plurality of (here, six (6)) processing chambers PM1 to PM6, each of which performs a predetermined process processing on a substrate such as, for example, a semiconductor wafer (hereinafter, which may also be simply referred to as a "wafer") W, a conveyance unit 120 configured to perform carry-out/in of a wafer W in relation to the processing unit 110 within an atmospheric-pressure atmosphere, and a control unit 300 configured to control the operations of the entire device.

Respective processing chambers PM1 to PM6 herein are configured to be equal to each other. For example, each of the processing chambers PM1 to PM6 is provided with a processing container 140 of which a pressure is reducible, and is configured to generate plasma of a processing gas on a wafer W mounted on a mounting table installed within the processing container 140 so as to perform a process processing such as, for example, etching or film forming on a surface of the wafer W. As a result, the same process processing may be performed even if the wafer is carried into any of the processing chambers PM1 to PM6.

In addition, each of the processing chambers PM1 to PM6 is configured to perform a cleaning processing in a state where no wafer exists in the processing chamber (waferless cleaning) by carrying out a wafer W therefrom after the process processing on the wafer W is terminated. The cleaning processing herein refers to a cleaning processing which causes a wafer not to be carried into a processing chamber in which the cleaning processing is being performed. For example, the cleaning processing may be performed in a state where plasma is generated in the processing chamber by introducing a cleaning gas into the processing chamber, or in a state where plasma is not generated in the processing chamber. In addition, although FIG. 1 exemplifies a substrate conveyance device 100 which is provided with six (6) processing chambers, the substrate conveyance device 100 is not limited thereto and may be provided with five or less processing chambers.

A conveyance chamber 130 of the conveyance unit 120 is configured by a housing with a substantially rectangular shape in cross section in which an inert gas such as, for example, $N_2$ or clean air is circulated. A plurality of cassette mounting tables 132A to 132C is arranged side by side on one side surface of the conveyance chamber 130 which forms one of the long sides of the substantially rectangular shape in cross section. Cassette mounting tables 132A to 132C are mounted on the cassette containers 134A to 134C, respectively. On the side wall of the conveyance chamber 130, three (3) load ports 136A to 136C as inlet ports of wafers W are provided to correspond to the cassette mounting tables 132A to 132C, respectively.

FIG. 1 exemplifies that, for example, each of three (3) cassette containers 134A to 134C is mounted on one of the cassette mounting tables 132A to 132C. However, the number of cassette mounting tables and cassette containers are not limited thereto, and for example, one (1) or two (2) cassette mounting tables and cassette containers may be provided. In addition, four (4) or more cassette mounting tables and cassette containers may be provided.

Each of the cassette containers 134A to 134C is configured to accommodate one (1) lot (e.g., 25 wafers) or more of wafers W by arranging the wafers W in multiple stages therein, and has a hermetically sealed structure, the inside of which is filled with, for example, $N_2$ gas atmosphere. In addition, the conveyance chamber 130 is configured such that the wafers W may be carried into/out from the inside through the load ports 136A to 136C.

Within the conveyance chamber 130, a conveyance unit side conveyance arm device 160 is installed in which the conveyance unit side conveyance arm 160 is configured by, for example, an articulated arm configured to be capable of being folded/unfolded, moved up/down, and rotated. The conveyance unit side conveyance arm device 160 is configured to convey a wafer W along its longitudinal direction (the arrow direction indicated in FIG. 1). Specifically, the conveyance unit side conveyance arm device 160 is fixed on a base 162 which is configured to be slidable on a guide rail (not illustrated) by a linear motor driving mechanism in the central portion within the conveyance chamber 130. The conveyance unit side conveyance arm device 160 is provided with a conveyance arm which is provided with a pick (end effecter) configured to maintain the wafer W. In such a case, the conveyance unit side conveyance arm device 160 may be, for example, a double arm mechanism with two conveyance arms as illustrated in FIG. 1 or a single arm mechanism with one conveyance arm.

An orienter (pre-alignment stage) 137 serving as a wafer W positioning device may be installed in one end of the conveyance chamber 130, that is, on one side surface that forms one of the short sides of the substantially rectangular shape in cross section. For example, the orienter 137 includes therein an optical sensor 139 which optically detects circumferential edges of the rotary mounting table 138 and the wafer W so as to align the wafer W by detecting, for example, an orientation flat or a notch of the wafer W.

Next, an exemplary configuration of the processing unit 110 will be described. As illustrated in FIG. 1, the processing unit 110 includes a common conveyance chamber 112 which is formed in a polygonal shape (e.g., a hexagonal shape) in cross section. Around the common conveyance chamber 112, the processing chambers PM1 to PM6 are connected through gate valves 142, respectively.

In addition, around the common conveyance chamber 112, front ends of first and second load-lock chambers LLM are connected through gate valves (vacuum pressure side gate valves) 142, respectively, in which base ends of the first and second load-lock chambers LLM are connected to the other side surface which forms the other long side of the substantially rectangular shape in cross section in the conveyance chamber 130, through gate valves (atmospheric pressure side gate valves) 118, respectively.

The common conveyance chamber 112 is configured such that the inside thereof may be controlled to a predetermined vacuum pressure, and has a function of performing carry-out/in of a wafer W between respective processing chambers PM1 to PM6, or between each of the processing chambers PM1 to PM6 and each of the first and second load-lock chambers LLM.

The first and second load-lock chambers LLM have a function of temporarily maintaining a wafer W and then passing the wafer W to the next stage after the pressure is adjusted. Delivery tables 116 may be installed within the first and second load-lock chambers LLM, respectively, in which a wafer W may be mounted on each of the delivery tables 116.

A processing unit side conveyance arm device 150 is installed within the common conveyance chamber 112, in which the processing unit side arm device 150 is configured by an articulated arm which is configured to be capable of being folded/unfolded, moved up/down, and rotated. The processing unit side conveyance arm device 150 includes two (2) conveyance arms 152A and 152B, and a pick (end effecter) configured to hold a wafer W is installed at the front end of each of the conveyance arms 152A and 152B. By the two conveyance arms 152A and 152B, two wafers W may be handled at one time.

The processing unit side conveyance arm device 150 is rotatably supported on the base 154. The base 154 is configured to be slidable on guide rails 156 disposed to extend from the base end side to the front end side of the common conveyance chamber 112, by, for example, a slide driving motor (not illustrated). In addition, a flexible arm 158 configured to pass a wire of, for example, an arm rotating motor therethrough is connected to the base 154.

According to the processing unit side conveyance arm device 150 configured as described above, the processing unit side conveyance arm device 150 may access each of the first and second load-lock chambers LLM and each of the processing chambers PM1 to PM6 by being slid along the guide rails 156. For example, when causing the processing unit side conveyance arm device 150 to access the first and second load-lock chambers LLM and the processing chambers PM1 and PM6 which are disposed to face each other, the processing unit side conveyance arm device 150 is positioned in the vicinity of the base end side of the common conveyance chamber 112 along the guide rails 156.

In addition, when causing the processing unit side conveyance arm device 150 to access the other four (4) processing chambers PM2, PM3, PM4, and PM5, the processing unit side conveyance arm device 150 is positioned in the vicinity of the front end side of the common conveyance chamber 112 along the guide rails 156. As a result, one processing unit side conveyance arm device 150 may access all the processing chambers PM1 to PM6 and the first and second load-lock chambers LLM which are connected to the common conveyance chamber 112.

A control unit (entire control device) 300 is connected to the substrate conveyance device 100 so that each component of the substrate conveyance device 100 may be controlled by the control unit 300. In addition, the control unit 300 is connected with an operating unit 310 which includes, for example, a keyboard through which an operator performs an input operation of commands so as to manage the substrate conveyance device 100 and a display which visualizes and displays an operation situation of the substrate conveyance device 100.

In addition, the control unit 300 is connected with a storage unit 320 which stores, for example, programs for implementing various processings which are executed in the substrate conveyance device 100 (e.g., a conveyance control of the wafers W besides the process processing on the wafers W and the cleaning processing thereafter) by the control of the control unit 300 or processing conditions (recipes) required for executing the programs.

The storage unit 320 stores information required for various processings such as, for example, a plurality of processing conditions (recipes) used in the process processings of the wafers W, conveyance-sequence categories S1, S2 and S3 to be described later, and a plurality of operation patterns $A_s$, $B_s$, $A_q$, and $B_q$ which are associated with each of the conveyance-sequence categories, as well as calculation equations for selecting the conveyance-sequence categories (e.g., the calculation equations as illustrated in FIG. 5 to be described later). The processing conditions include, for example, a process processing time, a cleaning processing time, a flow rate ratio of a processing gas, a pressure within the processing chamber, and a high frequency power.

The programs and the processing conditions may be stored in a hard disc or a semiconductor memory. In addition, the programs and the processing conditions may be adapted to be set at a predetermined position of the storage unit 320 in a state where they are received in a portable and computer-readable storage medium such as, for example, a CD-ROM and a DVD.

The control unit 300 reads a desired program or a desired processing condition from the storage unit 320 based on, for example, an instruction from the operating unit 310 to control each component so that a desired processing may be executed in the substrate conveyance device 100. In addition, the processing conditions are adapted to be edited by an operation from the operating unit 310.

(Operation of Substrate Conveyance Device)

Next, operations of the substrate conveyance device 100 configured as described above will be described. The substrate conveyance device 100 according to the present exemplary embodiment is configured to execute process processings in parallel on twenty five (25) wafers W of one lot within a plurality of processing chambers. The processing chambers to be used for such parallel processings may be set in advance, and the wafers W are conveyed to the set processing chambers. The parallel processings herein may include, for example, parallel processings with OR conveyance. The OR conveyance refers to a conveyance method of conveying the wafers W in sequence in relation to the plurality of processing chambers which are ready for a processing and empty. Herein, descriptions will be made on a case where the parallel processings with the OR conveyance are performed using processing chambers PM1, PM2, and PM3 by way of the load-lock chambers LLM, as an example.

For example, when a process pressing is performed on the wafers W accommodated in the cassette container 134A in the processing chamber PM1, the conveyance unit side conveyance arm device 160 carries out a wafer W from the cassette container 134A and then carries the wafer W into the orienter 137 in which positioning is performed. Thereafter, the conveyance unit side conveyance arm device 160 carries out the wafer W from the orienter 137 and then carries the wafer W into a load-lock chamber LLM in which an indoor pressure is adjusted.

Next, when the pressure adjustment is terminated in the load-lock chamber LLM, the wafer W is carried out from the load-lock chamber LLM and then carried into the processing chamber PM1 by the processing unit side conveyance arm device 150. In the processing chamber PM1, the process processing is performed on the wafer W for a predetermined process processing time. Thereafter, the wafer W is carried out from the processing chamber PM1 by the processing unit side conveyance arm device 150, and a cleaning processing is performed in the processing chamber PM1 for a predetermined cleaning processing time.

At this time, a next wafer W is taken out from the cassette container 134A and then carried into the load-lock chamber LLM in which pressure adjustment is performed. When the pressure adjustment of the load-lock chamber LLM is terminated, the next unprocessed wafer W is carried out from the load-lock chamber LLM by the processing unit side conveyance arm device 150, and the processed wafer W carried out from the processing chamber PM1 is carried into the load-lock chamber LLM.

Here, since the processing unit side conveyance arm device 150 of the present exemplary embodiment is provided with two (2) conveyance arms 152A and 152B, the carry-out/in may be performed to exchange the processed wafer W with an unprocessed wafer W. For example, when the conveyance arm 152A holds the processed wafer W and the other conveyance arm 152B is empty, the empty conveyance arm 152B carries out the unprocessed wafer W from the load-lock chamber LLM, and immediately after, the conveyance arm 152A carries the processed wafer W held therein into the load-lock chamber LLM.

In such a case, when three (3) processing chambers PM1, PM2, and PM3 are set as the processing chambers to perform parallel processings (e.g., OR conveyance processings), and a series of process processings as described above are performed in parallel in the processing chambers PM1, PM2, and PM3, the total throughput may be improved by causing the processing unit side conveyance arm device 150 to be operated even if a processing process or a cleaning processing is being performed in the processing chambers PM1, PM2, and PM3.

However, the process processing time and the cleaning processing time are varied depending on processing conditions of the wafers W (process recipes). Recently, the processing conditions of process processings are also diversified according to as elements formed on wafers W are diversified. Thus, when the operations of the processing unit side conveyance arm device 150 are determined in advance, it may be difficult to deal with various processing conditions.

In particular, a next unprocessed wafer W cannot be carried into a processing chamber in which the cleaning processing is being performed. Therefore, when the cleaning processing time is long, it is considered that a waiting time of the processing unit side conveyance arm device 150 is caused in a state where the unprocessed wafer W is held therein. On the contrary, when the cleaning processing time is short, it is considered that even if the cleaning is terminated, the next unprocessed wafer cannot be carried into the processing chamber until the processing unit side conveyance arm device 150 becomes empty, and as a result, a waiting time of the processing chamber is caused.

In addition, the process processing time or the cleaning processing time may be changed over time according to a state within the processing chambers. In addition, when the state within the processing chambers is recovered like the processing chambers after maintenance, the process processing time or the cleaning processing time may be changed accordingly. Even in such a case, when the operations of the processing unit side conveyance arm device 150 are determined in advance, the operating efficiency of the processing unit side conveyance arm device 150 or the processing chambers may be degraded.

In addition, it may be desired to correct an operation time when switching to a wafer processing of a different processing condition is performed or according to a processed result of a process processing. Even in such a case, when the operations of the processing unit side conveyance arm device 150 are determined in advance, for example, a wafer W to be carried out due to the termination of the process may not be carried out at that timing. As a result, an unnecessary waiting time may be caused and as a result, the throughput may be degraded.

Accordingly, in the present exemplary embodiment, a conveyance sequence may be scheduled by selecting a conveyance-sequence category according to the number of steps of operating the processing unit side conveyance arm device 150 during the cleaning of the chambers according to processing conditions, selecting and configuring operation patterns according to the processing conditions, and combining the operation patterns in such a manner of selecting a next operation pattern according to a conveyance state estimated by an operation pattern configured immediately before the next operation pattern.

When the processing unit side conveyance arm device 150 is operated based on the conveyance sequence scheduled in this manner, it is also possible to accurately deal with various processing conditions by an optimum combination of operation patterns, and as a result, the total substrate processing throughput may be improved by efficiently operating the processing unit side conveyance arm device 150 according to the processing conditions even during cleaning. In addition, the operation efficiency of the processing unit side conveyance arm device 150 and the processing chambers may be greatly improved according to the process processing time or the cleaning processing time.

In addition, even during the operation of the processing unit side conveyance arm device 150 based on the scheduled conveyance sequence, it is determined whether the conveyance efficiency of the processing unit side conveyance arm device 150 is degraded by monitoring the operation thereof, and when it is determined that the conveyance efficiency of the processing unit side conveyance arm device 150 is degraded, an efficient conveyance sequence is selected again and scheduling is performed again. As a result, it is possible to accurately deal with variations of the processing conditions such as, for example, the cleaning processing time, and as a result, the operation of the processing unit side conveyance arm device 150 may be efficiently controlled.

Here, specific examples of such conveyance-sequence categories will be described. Here, descriptions will be made on a case where three of first, second and third conveyance sequences S1, S2 and S3 may be selected in advance when they are executed in parallel in the processing chambers PM1, PM2 and PM3 by way of the load-lock chambers LLM, as an example.

The first, second and third conveyance sequences S1, S2 and S3 refers to sequences of performing two, four and six operation steps of the processing unit side conveyance arm devices 150, respectively, until a next unprocessed wafer is carried into a processing chamber after a processed wafer is carried out from the processing chamber, that is, during a cleaning processing. The total processing throughput may be further improved since the two steps, four steps and six steps, and the number of operation steps (the number of skips) during the cleaning processing of a processing chamber into which a wafer cannot be carried may be increased, in the order of the conveyance sequences S1, S2 and S3.

(Conveyance-Sequence Category)

Hereinafter, the conveyance sequences S1, S2, and S3 will be described in detail with reference to the drawings. FIGS. 2A to 2E are views for describing operation steps of the processing unit side conveyance arm device 150 by the conveyance sequence S1, FIGS. 3A to 3G are views for describing operation steps of the processing unit side conveyance arm device 150 by the conveyance sequence S2, and FIGS. 4A to 4I are views for describing operation steps of the processing unit side conveyance arm device 150 by the conveyance sequence S3.

Figure 2A:
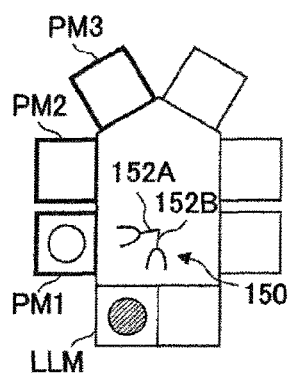
Figure 2B:
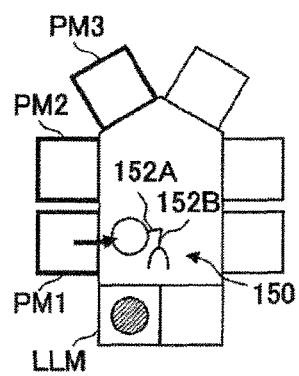

As illustrated in FIGS. 2A and 2B, a state in which one wafer W exists in each of one processing chamber (e.g., the processing chamber PM1) and one load-lock chamber LLM, and both of the conveyance arms 152A and 152B are in the empty state without holing a wafer W (FIG. 2A) as illustrated is taken as the initial state in the first conveyance sequence S1. From the initial state, when a process processing is terminated in the processing chamber PM1, one conveyance arm 152A holds and carries out the processed wafer W from the processing chamber PM1 (FIG. 2B).

When the processed wafer W is carried out, the cleaning processing is performed in the processing chamber PM1. During that time, the conveyance arms performs two operation steps of carry-in and carry-out of wafers W in relation to the load-lock chamber LLM.

Figure 2C:
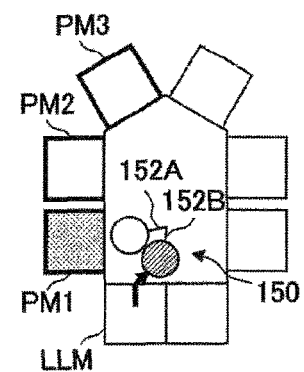
Figure 2D:
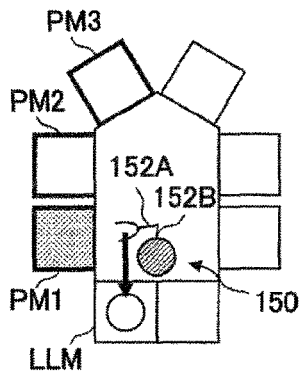
Figure 2E:
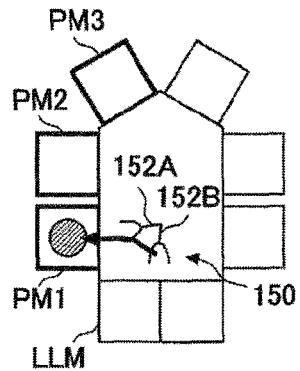

Specifically, as illustrated in FIGS. 2C to 2E, an unprocessed wafer W is carried out from the load-lock chamber LLM by the conveyance arm 152B (FIG. 2C), and the processed wafer W held by the conveyance arm 152A is carried into the load-lock chamber (LLM) (FIG. 2D). Then, the unprocessed wafer W held by the other conveyance arm 152B is carried into the processing chamber PM1 (FIG. 2E).

Figure 3A:
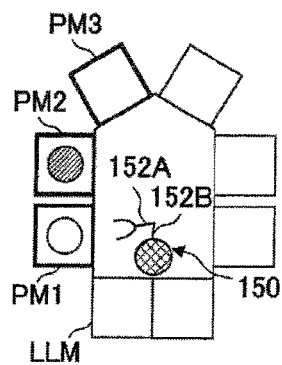
Figure 3B:
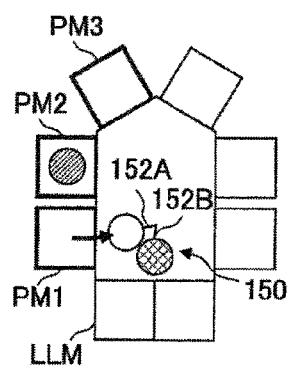

As illustrated in FIGS. 3A and 3B, the following state is taken as the initial state in the conveyance sequence S2: (1) one processing chamber (e.g., the processing chamber PM3) among three (3) processing chambers is in the empty state where no wafer W exists therein, and other two processing chambers (e.g., the processing chambers PM1 and PM2) are in the state where a wafer W is carried into each of them, (2) both load-lock chambers LLM are in the empty state in which no wafer W exists therein, and (3) one conveyance arm 152A is in the empty state where no wafer W exists therein and the other conveyance arm 152B is in the state where an unprocessed wafer W is held therein (FIG. 3A). From the initial state, when a process processing is terminated in the processing chamber PM1, the one conveyance arm 152A holds the processed wafer W and carries out the processed wafer W from the processing chamber PM1 (FIG. 3B).

When the processed wafer W is carried out, a cleaning processing is performed in the processing chamber PM1. During that time, the conveyance arms perform four operation steps of: carry-in of the unprocessed wafer W into the empty processing chamber, carry-out and carry-in of wafers W in relation to a load-lock chamber LLM, and carry-out of the processed wafer W from another processing chamber.

Figure 3C:
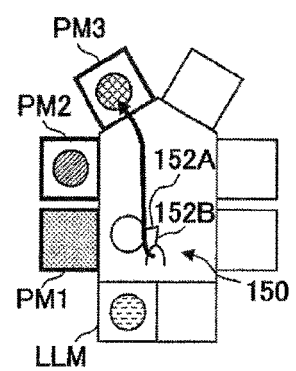
Figure 3D:
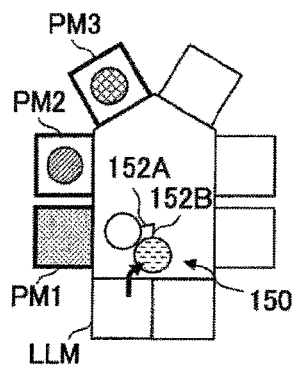
Figure 3E:
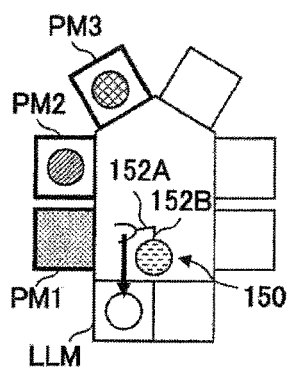
Figure 3F:
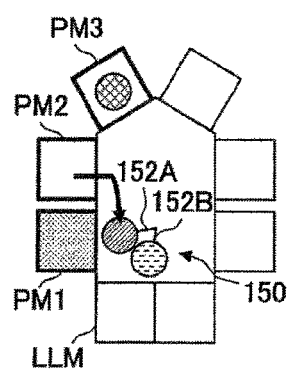
Figure 3G:
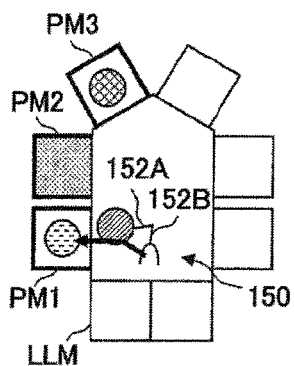

Specifically, as illustrated in FIGS. 3C to 3G, the unprocessed wafer W held in the other conveyance arm 152B is carried into other empty processing chamber PM3 (FIG. 3C). Subsequently, the other empty conveyance arm 152B carries out an unprocessed wafer W from the load-lock chamber LLM (FIG. 3D), and the processed wafer W held by the one conveyance arm 152A is carried into the load-lock chamber LLM (FIG. 3E). Subsequently, the one empty conveyance arm 152A carries out a processed wafer W from another processing chamber PM2 (FIG. 3F), and the unprocessed wafer W held by the other conveyance arm 152B is carried into the processing chamber PM1 (FIG. 3G).

Figure 4A:
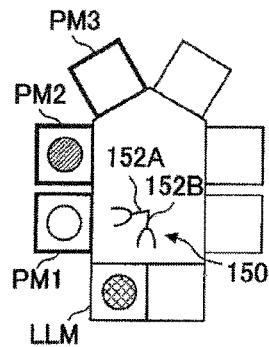
Figure 4B:
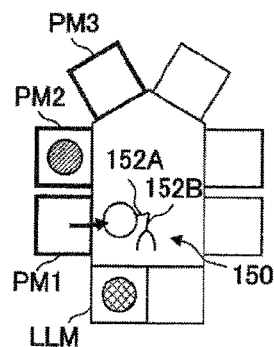
Figure 4C:
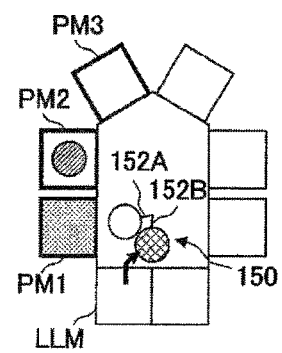

As illustrated in FIGS. 4A and 4B, the following state is taken as an initial state in the conveyance sequence S3: (1) one processing chamber (e.g., the processing chamber PM3) among three processing chambers in which parallel processings are performed is in the empty state where no wafer W exists and two other processing chambers (e.g., the processing chambers PM1 and PM2) are in the state where a wafer W is carried into each of them, (2) one load-lock chamber LLM is in the state where an unprocessed wafer W is carried therein, and (3) both conveyance arm 152A and 152B are in the empty state where no wafer W exists therein (FIG. 4A). From the initial state, when a process processing is terminated in the processing chamber PM1, one conveyance arm 152A holds the processed wafer W and carries out the processed wafer W from the processing chamber PM1 (FIG. 4B).

When the processed wafer W is carried out, a cleaning processing is performed in the processing chamber PM1. During that time, the conveyance arms perform six (6) operation steps of: carry-out of the unprocessed wafer W and carry-in of the processed wafer W in relation to the load-lock chamber LLM, carry-in of the unprocessed wafer W into the empty processing chamber, carry-out of the processed wafer W from another processing chamber, and carry-out of another unprocessed wafer W and carry-in of another processed wafer in relation to the load-lock chamber LLM.

Figure 4D:
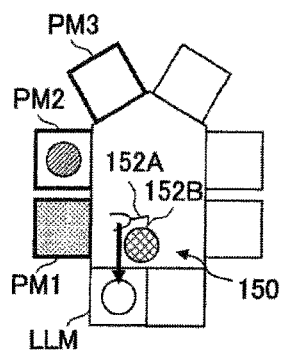
Figure 4E:
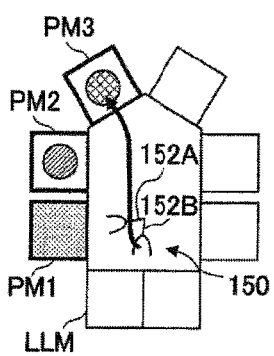
Figure 4F:
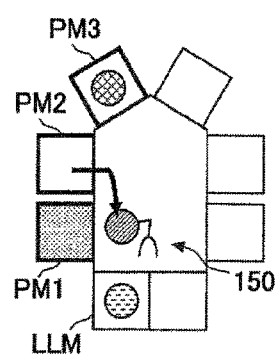
Figure 4G:
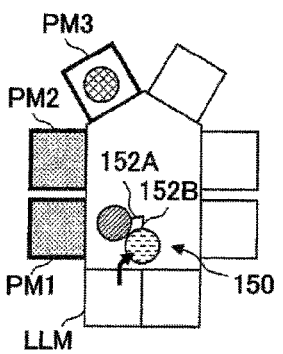

Specifically, as illustrated in FIGS. 4C to 4F, the other empty conveyance arm 152B carries out the unprocessed wafer W from the load-lock chamber LLM (FIG. 4C), and the one conveyance arm 152A carries the processed wafer W held therein into the load-lock chamber LLM (FIG. 4D). Subsequently, the unprocessed wafer W held by the other conveyance arm 152B is carried into the other empty processing chamber PM3 (FIG. 4E). Subsequently, the one conveyance arm 152A carries out the processed wafer W from another processing chamber PM2 (FIG. 4F).

Figure 4H:
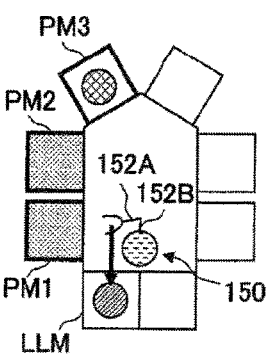
Figure 4I:
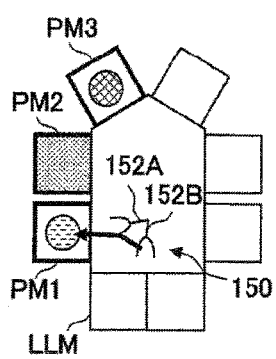

Next, the other empty conveyance arm 152B carries out an unprocessed wafer W from the load-lock chamber LLM (FIG. 4G), and the one conveyance arm 152A carries the processed wafer W held therein into the load-lock chamber LLM (FIG. 4H). Subsequently, the other conveyance arm 152B carries the unprocessed wafer W held therein into the processing chamber PM1 (FIG. 4I).

Among the conveyance sequences S1, S2, and S3, the conveyance sequences S2 and S3 are selected when the throughput is improved by using the conveyance sequences S2 and S3, rather than by taking the conveyance sequence S1 as a basic sequence and using the conveyance sequence S1.

(Method of Selecting Conveyance-Sequence Category)

Next, a method of selecting such conveyance-sequence categories will be described with reference to drawings. The method of selecting the conveyance-sequence categories is performed at the timing when a first wafer W is carried into, for example, a load-lock chamber LLM.

The conveyance-sequence categories S1, S2 and S3 are selected such that the best throughput may be obtained based on the number of processing chambers in which parallel processings (e.g., parallel processings with OR conveyance) are performed, and an operation time such as, for example, a process processing time or a cleaning processing time in the processing chambers, or a carry-in or carry-out time of a wafer.

For example, in each of the conveyance sequences S1, S2 and S3, a case classification is carried out on combinations of operation times which cause the throughput to be delayed so as to determine a plurality of rate-controlling patterns and to set calculation equations for calculating an operation time required per one (1) wafer in each of the rate-controlling patterns. In addition, an operation time per each rate-controlling pattern in each of the conveyance sequence S1, S2 and S3 is calculated, and the longest operation time is taken as an operation time required per one wafer in each of the conveyance sequences S1, S2 and S3.

Here, descriptions will be made on specific examples of calculation equations for calculating an operation time required per one (1) wafer in each of the above-described rate-controlling patterns. FIG. 5 illustrates a table in which each of the conveyance sequences S1, S2 are S3 is classified into four rate-controlling patterns to organize calculation equations of each of the rate-controlling patterns. Here, as illustrated in FIG. 5, the calculation equations are set in each of four rate-controlling patterns.

In FIG. 5, Tp refers to a process processing time in a processing chamber, and Tc refers to a cleaning processing time in a processing chamber. Tin refers to a time for carrying a wafer W into a processing chamber or a load-lock chamber, and Tout refers to a time for carrying out a wafer W from a processing chamber or a load-lock chamber. Tbf refers to a time for performing positional correction of a wafer W by a position sensor TNS (not illustrated) installed within the common conveyance chamber 112 before carrying the wafer W into a processing chamber, and Taf refers to a time for performing position correction of a wafer W by a position sensor TNS after the wafer W is carried out from a processing chamber, in which when the position correction by the sensors TNS is not performed, Tbf and Taf are calculated as zero (0).

Four rate-controlling patterns are set as described above since it is considered that two operation times of a processing chamber (the process processing time and the cleaning processing time), and two operation times of wafer carry-in and wafer carry-out are mainly rate-controlling factors and they are combined into four patterns. That is, a first rate-controlling pattern is a case in which both the process processing time and the cleaning processing time are short, and during these operations, the operation times of wafer carry-in and carry-out become relatively long. A second rate-controlling pattern is a case in which since the process processing time is short, the cleaning processing time is long, and the operation times of wafer carry-in and carry-out during the process become long. A third rate-controlling pattern is a case in which both the process processing time and the cleaning processing time become long. A fourth rate-controlling pattern is case in which since the cleaning processing time is short, the process processing time is long and the operation times of wafer carry-in and carry-out during cleaning become long.

The operation times of respective conveyance sequence S1, S2 and S3 which are calculated as described above are compared with each other so as to select a conveyance sequence with the shortest operation time. As a result, since the conveyance sequence in which the operation time per one (1) wafer becomes shortest may be selected, the total processing throughput may be efficiently improved.

In addition, when the operation times of respective conveyance sequences S1, S2 and S3 have the same value, the conveyance sequences are selected in the order of S1 (the number of skips is 2), S3 (the number of skips is 6) and S2 (the number of skips is 4). This is because when the operation times are equal to each other, the initial state in the conveyance sequence S1 is simple as compared to those in the conveyance sequences S2 and S3 and as a result, the initial operation may be terminated within a short time. In addition, since the conveyance sequence S3 (the number of skips is 6) has a large number of skips as compared to the conveyance sequence S2 (the number of skips is 4), the conveyance sequence S3 may easily deal with a delay when conveyance is performed from a cassette container to a load-lock chamber.

However, since many operation steps performed during the cleaning of a processing chamber exist in the above-described conveyance sequences S2 and S3, in some combinations of execution times of process processings and cleaning processings, a throughput may become faster when the order of respective operation steps is changed. For example, FIG. 3C of the conveyance sequence S3 exemplifies a case in which an operation of carrying an unprocessed wafer W into the other processing chamber PM3 is performed earlier. However, in some cases, the operation efficiency of the entire device may be good when the processed wafer is carried out earlier from the processing chamber PM2, like a case in which the execution time of the process processing is short.

Accordingly, it is preferable that the order of operation steps may be varied according to a situation. For this reason, a plurality of operation patterns configured by a plurality of operation steps of which the orders are different from each other is prepared in advance, and each of the conveyance sequences S2 and S3 is scheduled by changing a combination of each operation pattern according to a variation of a operation time such as, for example, a process processing time or a cleaning processing time, or an operation situation.

(Scheduling of Conveyance Sequence)

Hereinafter, descriptions will be made on a scheduling method of the conveyance sequences S2 and S3. Here, each of the conveyance sequences S2 and S3 is divided into three steps of a first step (intro phase), a second step (first phase), and a third step (regular phase). In addition, scheduling is performed by combining the plurality of previously prepared operation patterns of the conveyance arms in each step.

A scheduling purpose of conveyance sequence is as follows. That is, the purpose is to combine operation patterns, of which the number is equal to the number of processing chambers in which parallel processings are performed, so that the total throughput is reduced according to a variation of an operating time such as, for example a process processing time or a cleaning processing time, so as to take the combined operation patterns as one cycle, and to configure a regular conveyance sequence for implementing the number of steps (the number of skips) of the conveyance arms during the cleaning of the conveyance sequence by repeating the one cycle.

For this reason, in the first step, a predetermined wafer W arrangement pattern (form) required for configuring the regular conveyance sequence is established first and the wafer W arrangement pattern is taken as the initial state. In the second and third steps, a conveyance sequence is configured by combining operation patterns, of which the number is equal to the number of processing chambers in which the parallel processings are performed, to take the combined operation patterns as one cycle, and repeating the one cycle. The second step is one cycle for transition from the initial state to the cycle (repeated cycle) of the third step and in the second step, the operation patterns of which the number is equal to the number of operation patterns of the third steps, is taken as one cycle, and the method of establishing the cycle is the same as that in the third step.

(Scheduling of Second Conveyance Sequence)

Figure 6A:
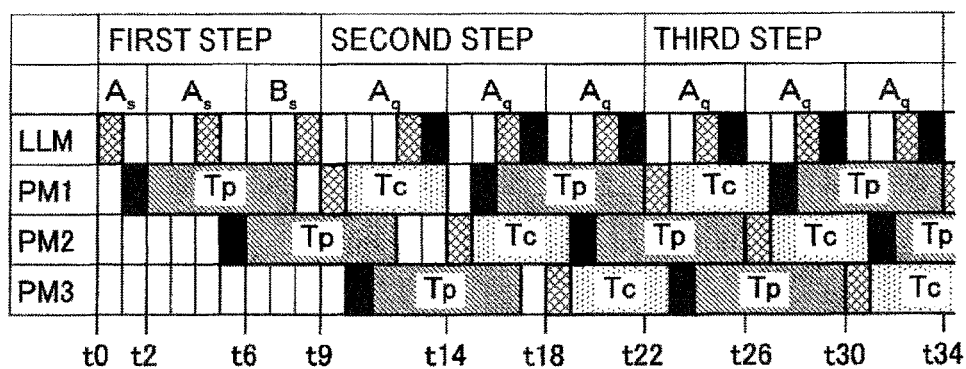
FIG. 6A is a time chart illustrating a specific example of scheduling of the conveyance sequence S2 in a case where a process processing time Tp in a processing chamber is short.
Figure 6B:
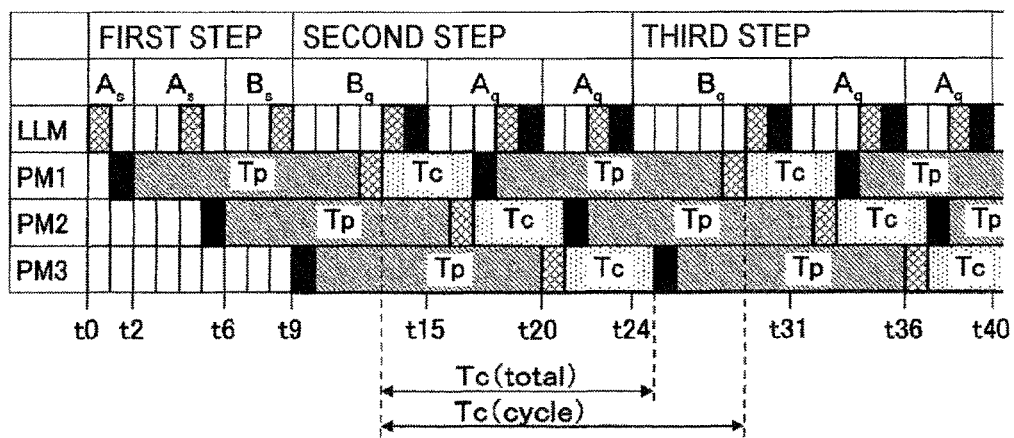
FIG. 6B is a time chart illustrating a specific example of scheduling of the conveyance sequence S2 in a case where a process processing time Tp in a processing chamber is long.

Here, a specific example when scheduling the conveyance sequence S2 in the above-described method will be divided into a case in which the process processing time is short and a case in which the process processing time is long, and the cases will be separately described. Each of FIGS. 6A and 6B is a time chart when scheduling the conveyance sequence S2. FIG. 6A illustrates the case in which the process processing time is short, and FIG. 6B illustrates the case in which the processing time is longer than that of FIG. 6A.

In FIGS. 6A and 6B, scheduling is performed by setting 1 cell as 6 sec. In FIGS. 6A and 6B, each of the wafer carry-in time Tin and the wafer carry-out time is set as 6 sec (1 cell), the cleaning processing time Tc is set as 24 sec (4 cells), the process processing time Tp in FIG. 6A is set as 36 sec (6 cells), and the process processing time Tp in FIG. 6B is set as 36 sec (6 cells).

Here, descriptions will be made on a case where the number of processing chamber PM1, PM2 and PM3 in which parallel processings are performed is three (n=3), and only the load-lock chamber LLM is used, as an example. In such a case, in the conveyance sequence S2, since the number of steps (the number of skips) of the conveyance arms is 4, for example, as illustrated in FIGS. 3A to 3E described above, scheduling is performed by dividing a sequence for implementing four steps of the conveyance arms into first to third steps so as to configure operation patterns. The operation patterns used in each step for performing the scheduling are as follows.

In the following operation patterns, a step including a position sensor TNS is applied to a case in which the TNS as described above is provided and position correction of a wafer W by the TNS is performed. When the TNS is not provided or when the position correction of a wafer W by the TNS is not performed, the step including the TNS in the following operation patterns is not performed. The present exemplary embodiment will be considered without the step including the TNS since the step including the TNS is not performed in the present exemplary embodiment.

[Operation Patterns of First Step]

(Operation Pattern $A_s$)

A step of carrying out a wafer from the load-lock chamber LLM

A step of performing position correction of a wafer by the TNS before the wafer is carried into a processing chamber (omitted in the present exemplary embodiment)

A step of carrying a wafer into a processing chamber PM (Operation Pattern $B_s$)

A step of carrying out a wafer from the load-lock chamber LLM (Operation Pattern $C_s$)

A step of carrying out a wafer from a processing chamber PM

A step of performing position correction of a wafer by the TNS after the wafer carried out from a processing chamber (omitted from the present exemplary embodiment)

A step of carrying a wafer into the load-lock chamber LLM

[Operation Patterns of Second and Third Steps]

(Operation Pattern $A_q$)

A step of carrying out a wafer from a processing chamber PM

A step of performing position correction of a wafer by the TNS before the wafer is carried into the processing chamber (omitted in the present exemplary embodiment)

A step of carrying a wafer into another processing chamber PM

A step of performing position correction of a wafer by the TNS after the wafer is carried out from a processing chamber (omitted in the present exemplary embodiment)

A step of carrying out a wafer from the load-lock chamber LLM

A step of carrying a wafer into the load-lock chamber LLM (Operation Pattern $B_q$)

A step of performing position correction of a wafer by the TNS before the wafer is carried into a processing chamber (omitted in the present exemplary embodiment)

A step of carrying a wafer into a processing chamber PM

A step of carrying out a wafer from another processing chamber PM

A step of performing position correction of a wafer by the TNS after the wafer is carried out from a processing chamber (omitted in the present exemplary embodiment)

A step of carrying out a wafer from the load-lock chamber LLM

A step of carrying a wafer into the load-lock chamber LLM

Among the operation patterns of the second and third steps, when the operation pattern $A_q$ of carrying out a wafer W from a processing chamber is performed successively two times or more, the number of steps of the conveyance arms during cleaning may be set as four (4). Accordingly, the sequence is scheduled to be capable of repeating the combination of operation patterns.

However, for example, when a process processing time in a processing chamber is long, the total throughput may become faster in some cases by carrying a wafer W into another processing chamber in which the cleaning is terminated, rather than by waiting the termination of the process and then carrying out a wafer W from the processing chamber. For this reason, as the operation patterns of the second and third steps, it is desirable to prepare not only the operation pattern $A_q$ of carrying out a wafer W from a processing chamber earlier as described above, but also the operation pattern $B_q$ of carrying a wafer W into another processing chamber in advance.

Using the operation patterns, scheduling of the conveyance sequence S2 in the case where the process processing time is short (FIG. 6A) will be described. First, the operation patterns of the first step are configured. In the first step herein, a wafer W arrangement pattern (form) for, implementing four steps (skips) of the conveyance arms during cleaning is established and the wafer W arrangement pattern is taken as the initial state.

Specifically, the state as illustrated in FIG. 3A is taken. Here, since the number of processing chambers in which the parallel processings are performed, n, is 3, the following state is taken as the initial state: (1) the processing chamber PM3 is in the empty state where no wafer W exists therein, and other two processing chambers PM1 and PM2 are in the state in which a wafer W is carried into each of them, (2) the load-lock chamber LLM is in the empty state in which no wafer W exists therein, and (3) one conveyance arm 152A is in the empty state where no wafer W exists therein, and the other conveyance arm 152B is in the state where an unprocessed wafer W is held therein.

At this time, by combining the above-described operation patterns $A_s$, $B_s$ and $C_s$, the wafer W arrangement state of the initial state may be established regardless of the wafer W arrangement state at that time. Here, descriptions will be made on a case where the initial state is established from the state where all the processing chambers PM1, PM2, and PM3 are empty, as an example.

In the initial first step (intro phase), the operation pattern $A_s$ of carrying out a wafer W from the load-lock chamber LLM and then carrying the wafer W into the processing chamber PM1 is configured (t0 to t2). Subsequently, the operation pattern $A_s$ of carrying out a next wafer W from the load-lock chamber LLM and carrying the next wafer W into the processing chamber PM2 is configured (t2 to t6). Subsequently, the operation pattern $B_s$ of carrying out a next wafer W from the load-lock chamber LLM and holding the next wafer W in the conveyance arm 152B is configured (t6 to t9). In this manner, a sequence of establishing the initial state as illustrated in FIG. 3A is scheduled.

In the next second step (first phase), among the operation pattern $A_q$ of carrying out a wafer W from a processing chamber first and the operation pattern $B_q$ of carrying a wafer W into another processing chamber, a pattern which makes the throughput faster is selected and configured. In this case, when the throughput becomes equal regardless of which one of the operation patterns $A_q$ and $B_q$ is configured, the operation pattern $A_q$ is preferentially configured in order to easily implement succession of the operation pattern $A_q$ of two times or more.

Specifically, as the operation pattern next to the initial state as illustrated in FIG. 6A, the operation pattern $A_q$ is configured since the throughput becomes equal regardless of which one of $A_q$ and $B_q$ is configured (t9 to t14). As the next operation pattern, the operation pattern $A_q$ is configured since the throughput obtained by carrying out a wafer W from another processing chamber PM2 is faster than that obtained by carrying a wafer W into the processing chamber PM1 (t14 to t18). Similarly in the next, since the throughput obtained by carrying a wafer W into the processing chamber PM1 is faster than that obtained by carrying out a wafer W from another processing chamber PM3, the operation pattern $A_q$ is configured (t19 to t22). As a result, when the scheduling corresponding to the number of processing chambers in which the parallel processings are performed is terminated, the process proceeds to the third step.

In the next third step (regular phase), similarly to the second step, among the operation patterns $A_q$ and $B_q$, an operation pattern which makes the throughput faster is selected and configured. In this case, when the throughput becomes equal regardless of which one of the operation patterns $A_q$ and $B_q$ is configured, the operation pattern $A_q$ is configured first in order to easily implement succession of the operation pattern $A_q$.

Specifically, as the operation pattern next to the state where the second step as illustrated in FIG. 6A is terminated, the operation pattern $A_q$ is configured since the throughput obtained by carrying out a wafer W from another processing chamber PM1 is faster than that obtained by carrying a wafer W into the processing chamber PM3 (t22 to t26). Similarly in the next, since the throughput obtained by carrying out a wafer W from another processing chamber PM2 is faster than that obtained by carrying a wafer W into the processing chamber PM1, the operation pattern $A_q$ is configured (t27 to t30). Similarly in the next, since the throughput obtained by carrying out a wafer W from another processing chamber PM3 is faster than that obtained by carrying a wafer W into the processing chamber PM2, the operation pattern $A_q$ is configured (t30 to t34).

As a result, when scheduling corresponding to the number of the processing chambers in which the parallel processings are performed is terminated, thereafter, the scheduling may be taken as one cycle and repeated so as to schedule the conveyance sequence S2. In the case where the process processing time is short as in the example of FIG. 6A, the conveyance sequence S2 capable of implementing the four (4) steps during the cleaning processing may be scheduled by repeating the operation pattern $A_q$.

Next, using the same operation patterns as those described above, descriptions will be made on scheduling of the conveyance sequence S2 in the case where the process processing time is long (FIG. 6B). First, the operation patterns of the first step are configured. In the first step herein, a wafer W arrangement pattern (form) for implementing the four (4) steps (skins) of the conveyance arms during cleaning is established and is taken as the initial state. In this case, the state is taken as illustrated in FIG. 3A. In addition, in order to take the initial state, the operation patterns $A_q$, $A_q$ and $B_q$ which are the same as those of FIG. 6A may be configured (t0 to t9). Thus, detailed descriptions thereof will be omitted.

In the next second step (first phase), the operation patterns from the initial state are different from those of FIG. 6A, and since the throughput obtained by carrying a wafer W into another PM3 is faster than that obtained by carrying out a wafer W from the processing chamber PM1, the operation pattern $B_q$ is configured (t9 to t15). As the next operation pattern, the operation pattern $A_q$ is configured since the throughput obtained by carrying out a wafer W from another processing chamber PM2 is faster than that obtained by carrying a wafer W into the processing chamber PM1 (t15 to t20). Similarly in the next, since the throughput obtained by carrying out a wafer W from another processing chamber PM3 is faster than that obtained by carrying a wafer W into the processing chamber PM2, the operation pattern $A_q$ is configured (t20 to t24). As a result, when scheduling corresponding to the number of processing chambers in which the parallel processings are performed is terminated, the process proceeds to the third step.

In the next third step (regular phase), the operation patterns from the state where the second step is terminated are different from those of FIG. 6A, and since carrying a wafer W into another processing chamber PM3 is faster than carrying out a wafer W from the processing chamber PM1, the operation pattern $B_q$ is configured (t24 to t31). As the next operation pattern, the operation pattern $A_q$ is configured since carrying out a wafer W from another processing chamber PM2 is faster than carrying a wafer W into the processing chamber PM1 (t31 to t36). Similarly in the next, carrying out a wafer W from another processing chamber PM3 is faster than carrying a wafer W into the processing chamber PM2, the operation pattern $A_q$ is configured (t36 to t40).

As a result, when scheduling corresponding to the number of the processing chambers in which the parallel processings are performed is terminated, thereafter, the scheduling is taken as one cycle and repeated so that the conveyance sequence S2 may be scheduled. As in the example of FIG. 6B, in the case where the process processing time is long, the operation patterns $B_q$, $A_q$ and $A_q$ are taken as one cycle and the one cycle is repeated so that the conveyance sequence S2 which is capable of executing four (4) steps during the cleaning processing may be scheduled.

(Scheduling of Third Conveyance Sequence)

Figure 7A:
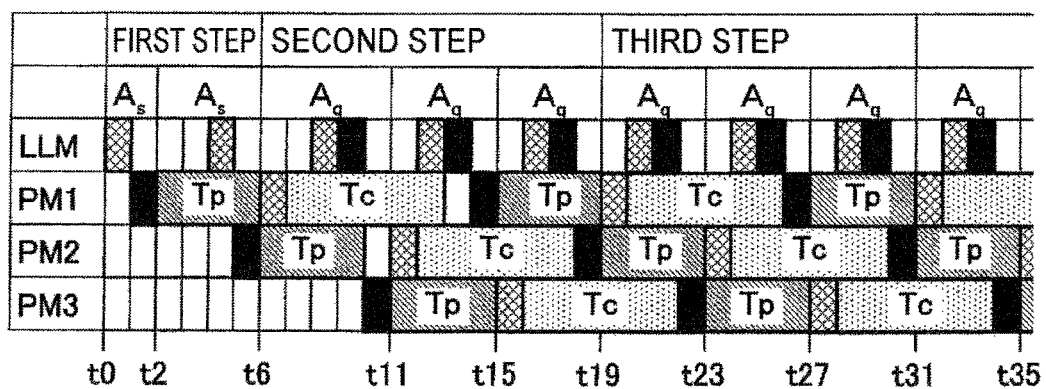
FIG. 7A is a time chart illustrating a specific example of scheduling of the conveyance sequence S3 in a case where a process processing time Tp in a processing chamber is short.
Figure 7B:
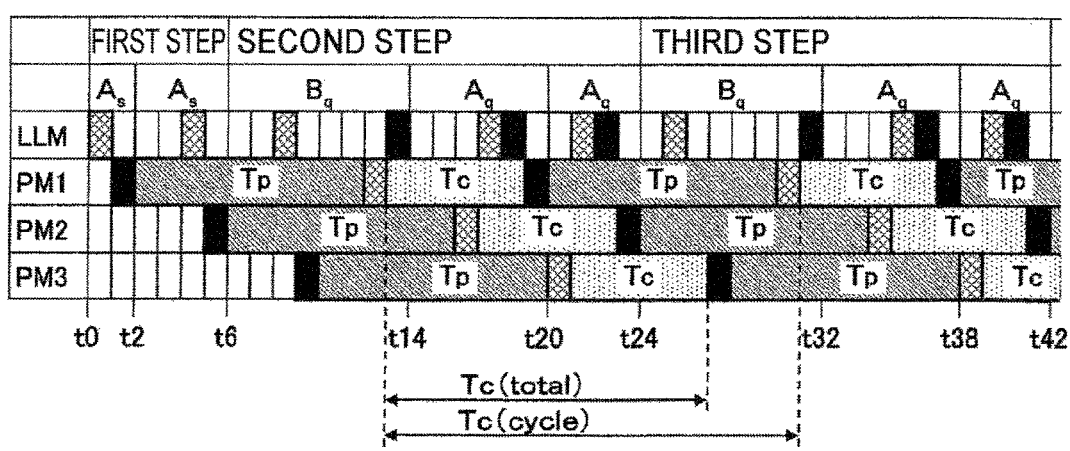
FIG. 7B is a time chart illustrating a specific example of scheduling of the conveyance sequence S3 in a case where a process processing time Tp in a processing chamber is long.

Next, specific examples when scheduling the conveyance sequence S3 will be divided into a case where the process processing time is short and a case where the process processing time is long and the cases will be separately described. Each of FIGS. 7A and 7B is a time chart when scheduling the conveyance sequence S3. FIG. 7A illustrates a case where the process processing time is short, and FIG. 7B illustrates a case where the processing time is longer than that of FIG. 7A.

In FIGS. 7A and 7B, scheduling is performed by setting 1 cell as 6 sec as in FIGS. 6A and 6B. In FIGS. 7A and 7B, each of the wafer carry-in time Tin and the wafer carry-out time is set as 6 sec (1 cell), the cleaning processing time Tc is set as 24 sec (4 cells), the process processing time Tp in FIG. 7A is set as 24 sec (4 cells), and the process processing time Tp in FIG. 7B is set as 60 sec (10 cells).

Here, descriptions will be made on a case where the number of processing chamber PM1, PM2 and PM3 in which parallel processings are performed is three (n=3), and only the load-lock chamber LLM is used, as an example. In such a case, in the conveyance sequence S3, since the number of steps (the number of skips) of the conveyance arms is 6, for example, as illustrated in FIGS. 4A to 4I described above, scheduling is performed by dividing a sequence for implementing the six (6) steps into first to third steps so as to configure operation patterns. The operation patterns used for the scheduling in each of the steps are as follows.

Among the following operation patterns, a step including a position sensor TNS is applied to a case in which the TNS as described above is provided and position correction of a wafer W by the TNS is performed. When the TNS is not provided or when the position correction of a wafer W by the TNS is not performed, the step including the TNS in the following operation patterns is not performed. The present exemplary embodiment will be considered without the step including the TNS since the step including the TNS is not performed in the present exemplary embodiment.

[Operation Patterns of First Step]

(Operation Pattern $A_s$)

A step of carrying out a wafer from the load-lock chamber LLM

A step of performing position correction of a wafer by the TNS before the wafer is carried into a processing chamber (omitted in the present exemplary embodiment)

A step of carrying a wafer into a processing chamber PM (Operation Pattern $B_s$)

A step of carrying out a wafer from a processing chamber PM

A step of performing position correction of a wafer by the TNS after the wafer is carried out from a processing chamber (omitted in the present exemplary embodiment)

A step of carrying a wafer into the load-lock chamber LLM

[Operation Patterns of Second and Third Steps]

(Operation Pattern $A_q$)

A step of carrying out a wafer from a processing chamber PM

A step of carrying out a wafer from the load-lock chamber LLM

A step of performing position correction of a wafer by the TNS after the wafer is carried out from a processing chamber (omitted in the present exemplary embodiment)

A step of carrying a wafer into the load-lock chamber LLM

A step of performing position correction of a wafer by the TNS before the wafer is carried into a processing chamber (omitted in the present exemplary embodiment)

A step of carrying a wafer into another processing chamber PM (Operation Pattern $B_q$)

A step of carrying out a wafer from the load-lock chamber LLM (maintaining a vacuum state of the load-lock chamber LLM after carry-out)

A step of performing position correction of a wafer by the TNS before the wafer is carried into a processing chamber (omitted in the present exemplary embodiment)

A step of carrying a wafer into a processing chamber PM

A step of carrying out a wafer from another processing chamber PM

A step of performing position correction of a wafer by the TNS after the wafer is carried out from a processing chamber (omitted in the present exemplary embodiment)

A step of carrying a wafer into the load-lock chamber LLM (terminating the vacuum state of the load-lock chamber LLM after carry-in)

Among the operation patterns of the second and third steps, when the operation pattern $A_q$ of carrying out a wafer W from a processing chamber is performed successively two times or more, the number of steps of the conveyance arms during cleaning may be set as six (6). Accordingly, the sequence is scheduled to be capable of repeating a combination of the operation patterns.

However, for example, when a process processing time in a processing chamber is long, in some cases, the total throughput obtained by carrying out an unprocessed wafer W from the load-lock chamber and then carrying the unprocessed wafer into another processing chamber in which cleaning is terminated may be faster than that obtained by waiting the termination of the process and then carrying out a wafer W from the processing chamber. For this reason, as the operation patterns of the second and third steps, it is desirable to prepare not only the operation pattern $A_q$ of carrying out a wafer W from a processing chamber first as described above, but also the operation pattern $B_q$ of carrying a wafer W into another processing chamber in advance.

Using the operation patterns, scheduling of the conveyance sequence S3 in the case where the process processing time is short (FIG. 7A) will be described. First, the operation patterns of the first step are configured. In the first step herein, a wafer W arrangement pattern (form) for implementing six (6) steps (skips) of the conveyance arms during cleaning is established and taken as the initial state.

Specifically, the state as illustrated in FIG. 4A is taken. Here, since the number of processing chambers in which parallel processings are performed, n, is 3, the following state is taken as the initial state: (1) the processing chamber PM3 is in the empty state where no wafer W exists therein, and other two processing chambers PM1 and PM2 are in the state in which a wafer W is carried into each of them, (2) one load-lock chamber LLM is in the state in which a wafer W is carried therein, and (3) both the conveyance arms 152A and 152B are in the empty state where no wafer W exists therein.

At this time, by combining the above-described operation patterns $A_s$ and $B_s$, an wafer arrangement state of the initial state may be established regardless of the wafer W arrangement state at that time. Here, descriptions will be made on a case where the initial state is established from the state where all the processing chambers PM1, PM2, and PM3 are empty, as an example.

In the initial first step (intro phase), the operation pattern $A_s$ of carrying out a wafer W from the load-lock chamber LLM and then carrying the wafer W into the processing chamber PM1 is configured (t0 to t2). Subsequently, the operation pattern $A_s$ of carrying out a next wafer W from the load-lock chamber LLM and carrying the next wafer W into the processing chamber PM2 is configured (t2 to t6). Then, when an unprocessed wafer W is carried into the load-lock chamber LLM, a sequence of establishing the initial state as illustrated in FIG. 4A is scheduled.

In the next second step (first phase), among the operation pattern $A_q$ of carrying out a wafer W from a processing chamber first and the operation pattern $B_q$ of carrying out an unprocessed wafer W from the load-lock chamber and then carrying the unprocessed wafer W into another processing chamber, one pattern which makes the throughput faster is selected and configured. In this case, when the throughput becomes equal regardless of which one of the operation patterns $A_q$ and $B_q$ is configured, the operation pattern $A_q$ is configured first in order to easily implement succession of the operation pattern $A_q$ of two times or more.

Specifically, as the operation pattern next to the initial state as illustrated in FIG. 7A, the operation pattern $A_q$ is configured since the throughput obtained by carrying out a wafer W from another processing chamber PM1 is faster than that obtained by carrying out a wafer W from the load-lock chamber LLM (t6 to t11). This is because the cycle time of carrying out the wafer W from the load-lock chamber LLM is long. Accordingly, when the cycle time of carrying out the wafer W from the load-lock chamber LLM is short, it is also possible to configure the operation pattern $B_q$.

As the next operation pattern, the operation pattern $A_q$ is configured since the throughput obtained by carrying out a wafer W from another processing chamber PM2 is faster than that obtained by carrying out an unprocessed wafer W from the load-lock chamber LLM and then carrying the unprocessed wafer W into the processing chamber PM1 (t11 to t15). Similarly in the next, since the throughput obtained by carrying a wafer W out from another processing chamber PM3 is faster than that obtained by carrying out an unprocessed wafer W from the load-lock chamber and then carrying the unprocessed wafer into the processing chamber PM2, the operation pattern $A_q$ is configured (t15 to t19). As a result, when the scheduling corresponding to the number of processing chambers in which the parallel processings are performed is terminated, the process proceeds to the third step.

In the next third step (regular phase), similarly to the second step, among the operation patterns $A_q$ and $B_q$, the operation pattern which makes the throughput faster is selected and configured. In this case, when the throughput becomes equal regardless of which one of the operation patterns $A_q$ and $B_q$ is configured, the operation pattern $A_q$ is configured preferentially in order to easily implement succession of the operation pattern $A_q$.

Specifically, as the operation pattern next to the state where the second step as illustrated in FIG. 7A is terminated, the operation pattern $A_q$ is configured since the throughput obtained by carrying out a wafer W from another processing chamber PM1 is faster than that obtained by carrying out a wafer W from the load-lock chamber LLM and then carrying the wafer W into the processing chamber PM3 (t19 to t23). Similarly in the next, since the throughput obtained by carrying out a wafer W from another processing chamber PM2 is faster than that obtained by carrying a wafer W into the processing chamber PM1, the operation pattern $A_q$ is configured (t23 to t27).

As a result, when scheduling corresponding to the number of the processing chambers in which the parallel processings are performed is terminated, thereafter, the scheduling is taken as one cycle and repeated so that the conveyance sequence S3 may be scheduled. In the case where the process processing time is short as in the example of FIG. 7A, the conveyance sequence S3 capable of executing six (6) steps during the cleaning processing may be scheduled by repeating the operation pattern $A_q$.

Next, using the same operation patterns as those described above, descriptions will be made on scheduling of the conveyance sequence S3 in the case where the process processing time is long (FIG. 7B). First, the operation patterns of the first step are configured. In the first step herein, a wafer W arrangement pattern (form) for implementing the six steps (skins) of the conveyance arms during cleaning is established and is taken as the initial state. In this case, the state is also taken as illustrated in FIG. 4A. In addition, in order to take this initial state, the operation patterns $A_q$ and $A_q$ which are the same as those of FIG. 7A may be configured (t0 to t9). Thus, detailed descriptions thereof will be omitted.

In the next second step (first phase), the operation patterns from the initial state are different from those of FIG. 7A, and since the throughput obtained by carrying out a wafer W from the load-lock chamber LLM and then carrying the wafer W into another processing chamber PM3 is faster than that obtained by carrying out a wafer W from the processing chamber PM1, the operation pattern $B_q$ is configured (t6 to t14). In this case, thereafter, there is time until a processed wafer W is carried into the load-lock chamber LLM. During that time, it is desirable to maintain the vacuum state of load-lock chamber LLM.

As the next operation pattern, the operation pattern $A_q$ is configured since the throughput obtained by carrying out a wafer W from another processing chamber PM2 is faster than that obtained by carrying a wafer W into the processing chamber PM1 (t14 to t20). Similarly in the next, since the throughput obtained by carrying out a wafer W from another processing chamber PM3 is faster than that obtained by carrying out a wafer W from the LLM and then carrying the wafer W into the processing chamber PM2, the operation pattern $A_q$ is configured (t20 to t24). As a result, when scheduling corresponding to the number of processing chambers in which the parallel processings are performed is terminated, the process proceeds to the third step.

In the next third step (regular phase), the operation patterns from the state where the second step is terminated are different from those of FIG. 7A, and since the throughput obtained by carrying out a wafer W from the load-lock chamber LLM and then carrying the wafer W into another processing chamber PM3 is faster than that obtained by carrying out a wafer W from the processing chamber PM1, the operation pattern $B_q$ is configured (t24 to t32). As the next operation pattern, the operation pattern $A_q$ is configured since the throughput obtained by carrying out a wafer W from another processing chamber PM2 is faster than that obtained by carrying out a wafer W from the load-lock chamber LLM and then carrying the wafer W into the processing chamber PM2 (t32 to t38). Similarly in the next, since the throughput obtained by carrying out a wafer W from another processing chamber PM3 is faster than that obtained by carrying out a wafer W from the load-lock chamber LLM and then carrying the wafer W into the processing chamber PM2, the operation pattern $A_q$ is configured (t38 to t42).

As a result, when scheduling corresponding to the number of the processing chambers in which the parallel processings are performed is terminated, thereafter, the scheduling is taken as one cycle and repeated so that the conveyance sequence S3 may be scheduled. As in the example of FIG. 7B, in the case where the process processing time is long, the operation patterns $B_q$ and $A_q$ are taken as one cycle and the one cycle is repeated so that the conveyance sequence S3 capable of executing six (6) steps during the cleaning processing may be scheduled.

The selection or scheduling of the conveyance sequences S1, S2 and S3 as described above may be performed at the timing when the first unprocessed wafer W is carried into the load-lock chamber LLM. Thereafter, the conveyance arms are practically controlled based on the conveyance sequences to repeat the operation patterns thereof.

During the continuation of the repeated operations by the conveyance arms, a device situation may be changed in some cases. There may be transition to a processing of which the process processing time is varied, for example, when switching from a dummy wafer (a seasoning wafer) W to a product wafer W is performed, or switching to a wafer W on which a different processing is performed. In addition, even if the same process processings are repeated, the process processing time or the cleaning processing time may be varied according to a variation of a situation within a processing chamber, for example, when extraneous matter is attached on an inner wall of the processing chamber. Further, the number of processing chambers in which the parallel processings are performed may be varied due to, for example, the trouble or maintenance of a processing chamber or the return thereof.

When the device situation is varied as described above, the throughput may become faster in some cases by changing the combination of the operation patterns of the conveyance arms. In such a case, the scheduling may be changed so as to re-establish a conveyance sequence.

(Re-Establishment of Conveyance Sequence)

Here, the re-establishment of such a conveyance sequence will be described. Here, it is assumed that after a processing of a dummy wafer W, of which the process processing time is long, is performed with the conveyance sequence illustrated in FIG. 6B or FIG. 7B, and the processing is switched to a processing of a product wafer, of which the process processing time is short so that the conveyance sequence illustrated in FIG. 6A or FIG. 7A may be scheduled.

In such a case, since the throughput obtained by the conveyance sequence which does not include the operation pattern $B_s$ as illustrated in FIG. 6A or FIG. 7A is faster than that obtained by the conveyance sequence including the operation pattern $B_s$ as illustrated in FIG. 6B or FIG. 7B, it is possible to make the throughput faster by changing the scheduling again to re-establish the conveyance sequence illustrated in FIG. 6A or FIG. 7A, rather than continuing the conveyance sequence illustrated in FIG. 6B or FIG. 7B as it is even after the switching to the processing of the product wafer W.

Accordingly, in such a case, whether to re-establish a conveyance sequence or not may be determined based on, for example, whether the operation pattern $B_s$ is included in a repeated cycle of the conveyance sequence. The determination in such a case may be made based on the following Equation 1, assuming that a time from initiation to termination of cleaning in all the processing chambers in which parallel processings are performed is Tc(total), and a time from initiation to termination of cleaning in one processing chamber is Tc(cycle). That is, when the following Equation (1) is satisfied, since the operation pattern $B_s$ is included in the repeated cycle of the conveyance sequence, it may be determined that re-establishment is required.

$$Tc(\text{total}) < Tc(\text{cycle}) \tag{1}$$

Here, assuming that a cleaning processing time is Tc, a cycle time per one load-lock chamber when an unprocessed wafer is carried into the load-lock chamber is Tl, the number of processing chambers in which parallel processings are performed is n, and the number of overlaps in cleaning processing times, i.e., an integer value of n/2, is n', and considering an overlapped length and the number of overlaps in the cleaning processing times in two processing chambers, Tc(total) in the conveyance sequence S2 may be calculated by, for example, the following Equation (2), and Tc(total) in the conveyance sequence S3 may be calculated by, for example, the following equation (4).

Assuming that a wafer carry-out time is Tout, a wafer carry-in time is Tin, and a process processing time is Tp, Tc(cycle) in the conveyance sequence S2 may be calculated by, for example, the following Equation (3), Tc(cycle) in the conveyance sequence S3 may be calculated by the following Equation (5). In the following Equation (4), Tbf is a time for performing position correction of a wafer by the TNS before the wafer is carried into a processing chamber, and Taf is a time for performing position correction of a wafer by the TNS. When the position correction of a wafer by the TNS is not performed, both Tbf and Taf are considered as zero.

(Conveyance Sequence S2)

$$Tc(\text{total}) = (Tc \times n) - (Tc - Tl) \times n' \tag{2}$$

$$Tc(\text{cycle}) = Tout + Tc + Tin + Tp \tag{3}$$

(Conveyance Sequence S3)

$$Tc(\text{total}) = (Tc \times n) - (Tc - Tl) \times n' + (Tout + Tc + Tbf + Taf) \times (n - n' - 1) \tag{4}$$

$$Tc(\text{cycle}) = Tout + Tc + Tin + Tp \tag{5}$$

For example, the operation pattern $B_s$ is included in the conveyance sequence illustrated in FIG. 6B. Thus, upon comparing Tc(total) and Tc(cycle), it may be found that Equation (1) is certainly satisfied. Even in the conveyance sequence illustrated in FIG. 7B, the operation pattern $B_s$ is included. Thus, upon comparing Tc(total) and Tc(cycle), it may be found that Equation (1) is certainly satisfied. When Equation (1) is used in this manner, it is possible to determine whether a conveyance sequence includes the operation pattern $B_s$.

Accordingly, when switching to a wafer W processing of which the process processing time is performed, determination as to where to re-establish a conveyance sequence is performed when the first wafer W at the switching is carried into the load-lock chamber LLM from the conveyance chamber 130 side. In addition, when it is determined that Equation (1) described above is not satisfied, the wafer W processing is continued as it is without re-establishing a conveyance sequence. When it is determined that Equation (1) as described above is satisfied, a conveyance sequence is re-established and the wafer W processing is performed based on the re-established conveyance sequence.

In an example where, for example, a processing of a product wafer W is performed after a dummy wafer W as described above, determination as to whether to re-establish a conveyance sequence is performed when the first product wafer W is carried into the load-lock chamber LLM from the conveyance chamber 130 side. In addition, when Equation (1) as described above is satisfied, a conveyance sequence is re-established and the product wafer W processing is performed based on the re-established conveyance sequence. As a result, process processings may be performed on product wafers W with a faster throughput.

Next, an example of re-establishing the conveyance sequence S3 will be described. Here, it is assumed that a dummy wafer W processing of which the process processing time is long is performed based on the conveyance sequence illustrated in FIG. 7B and then is switched to a product wafer processing of which the process processing time is short so that the conveyance sequence illustrated in FIG. 7A is available.

There may be a case in which wafers W have already been carried into all the processing chambers in which parallel processings are being performed at the timing of re-establishing a conveyance sequence. When the conveyance sequence is re-established in the state where wafers W have already been carried into all the processing chambers, the conveyance sequence may be configured such that which one of the operation patterns $A_q$ and $B_q$ it would be better to configure is determined in consideration of the rest of the process processing time in each processing chamber.

Figure 8:
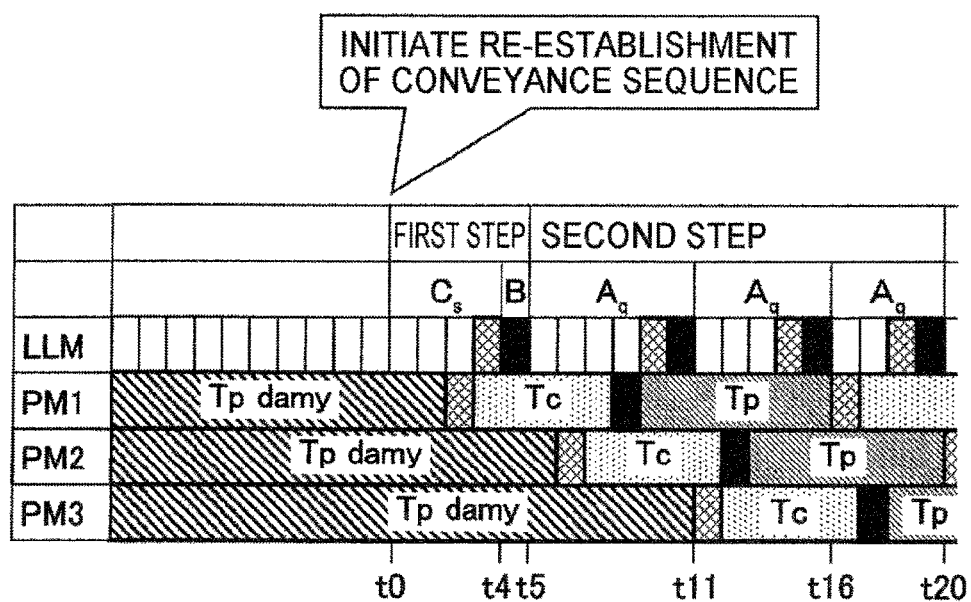
FIG. 8 is a time chart illustrating a specific example of scheduling of the conveyance sequence S2 in a case where scheduling is performed again during a conveyance sequence.

Here, referring to a specific example, FIG. 8 is a timing chart, switching to a product wafer W processing after a dummy wafer W processing is performed in each of processing chambers PM1 to PM4 in a case where parallel processings are performed in the four processing chambers PM1 to PM4. In FIG. 8, since the conveyance sequence S2 is performed on dummy wafers W, a time chart at a time of switching to a product wafer processing is presented. In FIG. 8, a conveyance sequence is re-established at the timing when a product wafer W is carried into the load-lock chamber. At this time, in the first step, the operation patterns $C_s$ and $B_s$ are configured and a wafer W arrangement pattern of the conveyance sequence S2 is established.

When proceeding to the next second step, it becomes necessary to determine which one of the operation patterns $A_q$ and $B_q$ it would be better to configure. In the example of FIG. 8, the rest of the process processing time in the processing chamber PM2 is short, and the timing when the process is terminated is earlier than the timing when the cleaning processing of the processing chamber PM1 is terminated. For this reason, the throughput becomes faster by carrying out a wafer W from the processing chamber PM2, rather than carrying a next wafer into the processing chamber PM1. Accordingly, in this case, the operation pattern $A_q$ is configured. Thus, when a conveyance sequence is re-established in consideration of the rest of the process processing time in each processing chamber, it is possible to schedule a conveyance sequence which improves the throughput.

(Substrate Conveyance Control)

Figure 9:
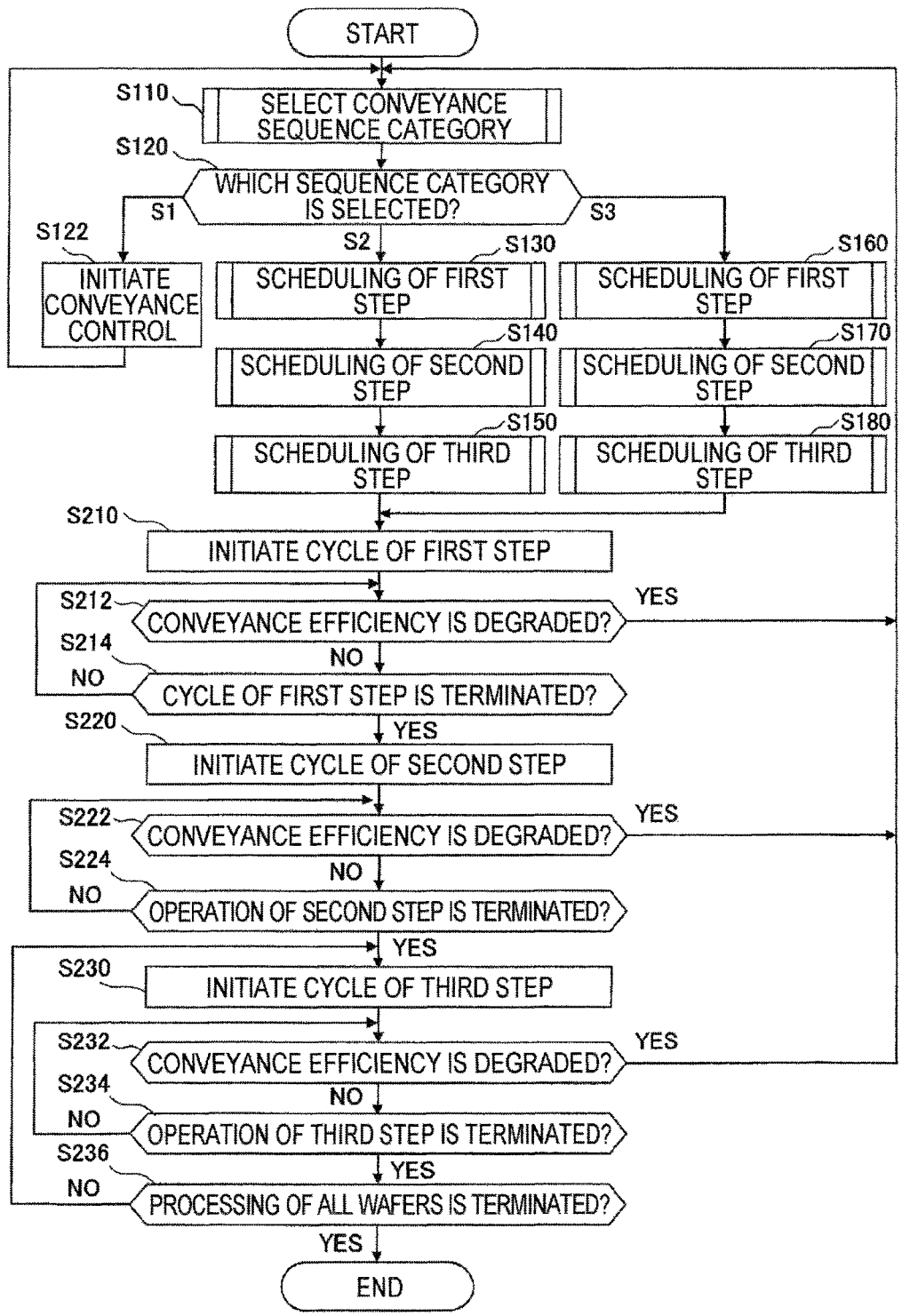
FIG. 9 is a flowchart illustrating a main routine of a wafer conveyance control performed by a control unit in the exemplary embodiment.

Next, a specific example when a substrate conveyance control of the conveyance arm device 150 according to the exemplary embodiment is performed by the control unit 300 of the substrate conveyance device illustrated in FIG. 1 will be described with reference to the drawings. FIG. 9 is a flowchart of a substrate conveyance control of the conveyance arm device 150 in the present exemplary embodiment. When a plurality of wafers W is successively processed, the substrate conveyance control illustrated in FIG. 9 is executed at the timing when the first wafer W is carried (loaded) into the load-lock chamber LLM from the conveyance chamber side. Here, a case in which parallel processings by the OR conveyance are performed using three processing chamber PM1, PM2, and PM3 will be described as an example.

When the first wafer W is carried into the load-lock chamber LLM from the conveyance chamber side, the control unit 300 selects conveyance-sequence categories at step S110 illustrated in FIG. 9. As described above, the conveyance-sequence categories herein are three categories: a conveyance sequence S1 in which the number of steps of the conveyance arm device 150 operated during the cleaning of a processing chamber is two (2) (FIGS. 2A to 2E), a conveyance sequence S2 in which the number of steps of the conveyance arm device 150 is four (4) (FIGS. 3A to 3G), and a sequence S3 in which the number of steps of the conveyance arm device 150 is six (6) (FIGS. 4A to 4I). In addition, the conveyance-sequence categories herein are illustrative only and are not limited to the three categories. Four or more conveyance-sequence categories may be configured to be selected depending on the number of operable steps of the conveyance arm device 150 during the cleaning.

Among the conveyance sequences S1, S2 and S3, a sequence which makes the throughput fastest is selected by the above-described methods based on processing conditions such as, for example, a process processing time and cleaning processing time, using the calculation equations illustrated in FIG. 5. A flow chart in a case where such a conveyance sequence selection processing is performed by the control unit 300 is illustrated in FIG. 10.

Figure 10:
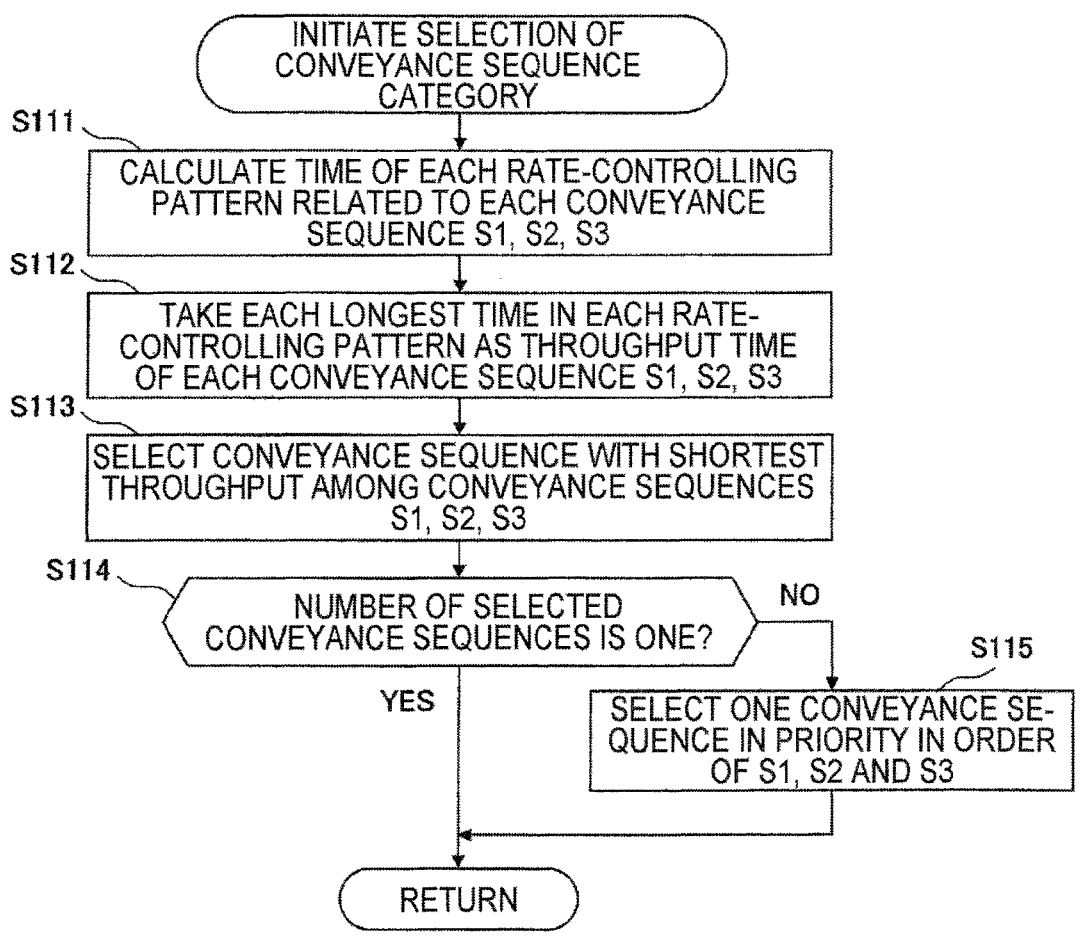
FIG. 10 is a flowchart illustrating sub-routines concerning a selection processing of the conveyance sequence categories illustrated in FIG. 9.

In the conveyance sequence selection processing, the control unit 300 calculates a time of each rate-controlling pattern first, using the calculation equations illustrated in FIG. 5 for each of the conveyance sequences S1, S2 and S3 in step S111 illustrated in FIG. 10. Next, in step S112, the longest time in each of the rate-controlling patterns is taken as a throughput time of each of the conveyance sequences S1, S2 and S3. In addition, in step S113, among respective conveyance sequences S1, S2 and S3, a conveyance sequence, of which the throughput is shortest, is selected.

Subsequently, in step S114, it is determined whether the number of selected conveyance sequences is one, and when it is determined that the number of selected conveyance sequences is one, the processing returns to the flowchart of FIG. 9 and proceeds to the processing of the next step S120. In addition, in step S114 when it is determined that a plurality of conveyance sequences is selected, that is, the throughputs have the same value, in step S115, one conveyance sequence is selected in the priority of order of conveyance sequences S1, S3 and S2 and the processing returns to the flowchart of FIG. 9 and moves to the processing of the next step S120.

After the next step S120, a processing according to the selected conveyance-sequence category is performed. That is, when it is determined in step 120 that the selected conveyance-sequence category is the conveyance sequence S1, in step S122, the conveyance arm device 150 is controlled to initiate a wafer W conveyance control of as illustrated in FIGS. 2A to 2E. When the selected conveyance-sequence category is the conveyance sequence S1), the number of steps is small since there are only carry-in and carry-out with respect to the load-lock chamber LLM during the cleaning of a processing chamber. For this reason, the conveyance control of the wafer W is performed without performing scheduling like the other conveyance sequences S2 and S3.

Whereas, when it is determined in step S120 that the selected conveyance-sequence category is the conveyance sequence S2 or S3, the number of steps during cleaning increases to either four (4) or six (6). Accordingly, scheduling for each conveyance sequence is performed before the conveyance control. The scheduling for each conveyance sequence S2 or S3 is performed in first step S130 or S160, second step S140 or S170, and third step S150 or S180.

First, descriptions will be made on a case where it is determined in step S120 that the selected conveyance-sequence category is the category S2. In this case, the scheduling of the first step is performed first in step S130 (e.g., t0 to t9 of FIG. 6A). Here, since the parallel processings are performed in three (3) processing chambers PM1, PM2 and PM3, in the first step herein, the operation patterns $A_s$, $B_s$ and $C_s$ of the above-described conveyance sequence S2 are combined to establish a predetermined wafer W arrangement pattern (form) as illustrated in FIG. 3A. A flowchart in the case where the controlling unit 300 performs the scheduling of the first step is illustrated in FIG. 11.

Figure 11:
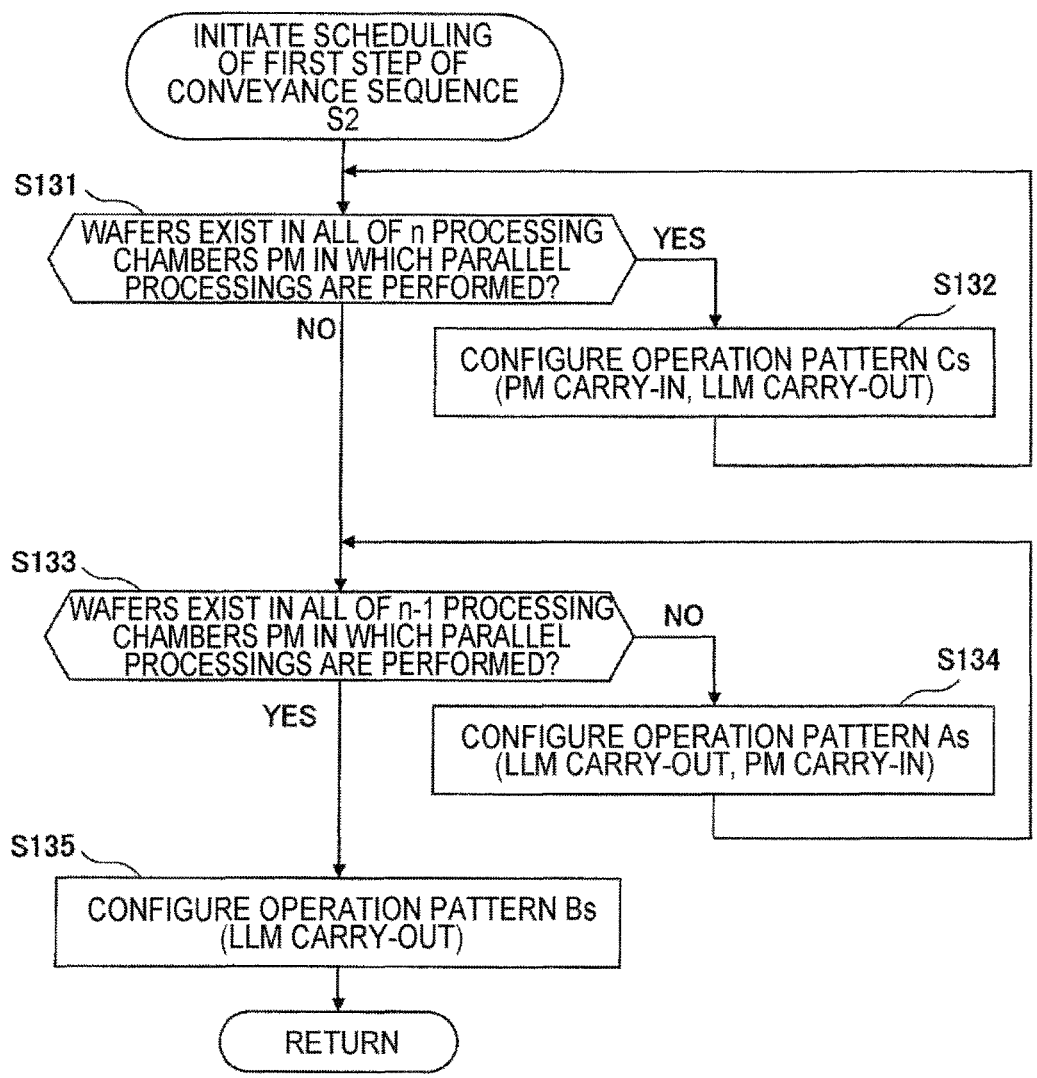
FIG. 11 is a flowchart illustrating a sub-routine concerning the scheduling of the first step of the conveyance sequence S2 illustrated in FIG. 9.

In the scheduling of the first step, the control unit 300 determines, in step S131 illustrated in FIG. 11, whether wafers are carried into all of n (here, three (3)) processing chambers PM1, PM2 and PM3 in which parallel processings are performed, at the moment when the first wafer W is loaded in the load-lock chamber. In step 131, when it is determined that the wafers W exist in all the processing chambers where the parallel processings are performed, the operation pattern $C_s$ is configured in step S132 (e.g., t0 to t4 of FIG. 8). This is because, in this case, the above-described wafer W arrangement pattern cannot be established unless the parallel processings are initiated from a processing of carrying out a wafer W from any one of the processing chambers.

Whereas, in step S131, when it is determined that there is an empty processing chamber in which no wafer W exists among the processing chambers in which the parallel processings are performed, in step S133, it is determined whether wafers exist in all of n−1 processing chambers, that is, whether there is only one empty chamber in which no wafer W exists among the processing chambers in which the parallel processings are performed. When it is determined in step S133 that the number of empty processing chambers is not only one, the operation pattern $A_s$ is configured in step S134 to return to the processing of step S133. In addition, the processings of steps S133 and S134 are repeated until the number of empty processing chambers becomes only one so as to establish the operation pattern $A_s$ (e.g., t0 to t6 of FIG. 6A).

When it is determined in step S133 that there is only one empty processing chamber, it is not necessary to carry a wafer W therein any more. Thus, the operation pattern $B_s$ is configured in step S135 (e.g., t6 to t9 of FIG. 6A). As a result, scheduling is performed to establish the wafer W arrangement pattern illustrated in FIG. 3A.

Subsequently, returning to the processing of FIG. 9, the scheduling of the second step is performed in step S140 (e.g., t9 to t22 of FIG. 6A). In the second step, operation patterns corresponding to one cycle to be connected to the next third step are configured. The operation patterns herein use the operation patterns $A_q$ and $B_q$ of the above-described conveyance sequence S2. A flowchart in a case where the control unit 300 performs the scheduling of the second step is illustrated in FIG. 12.

Figure 12:
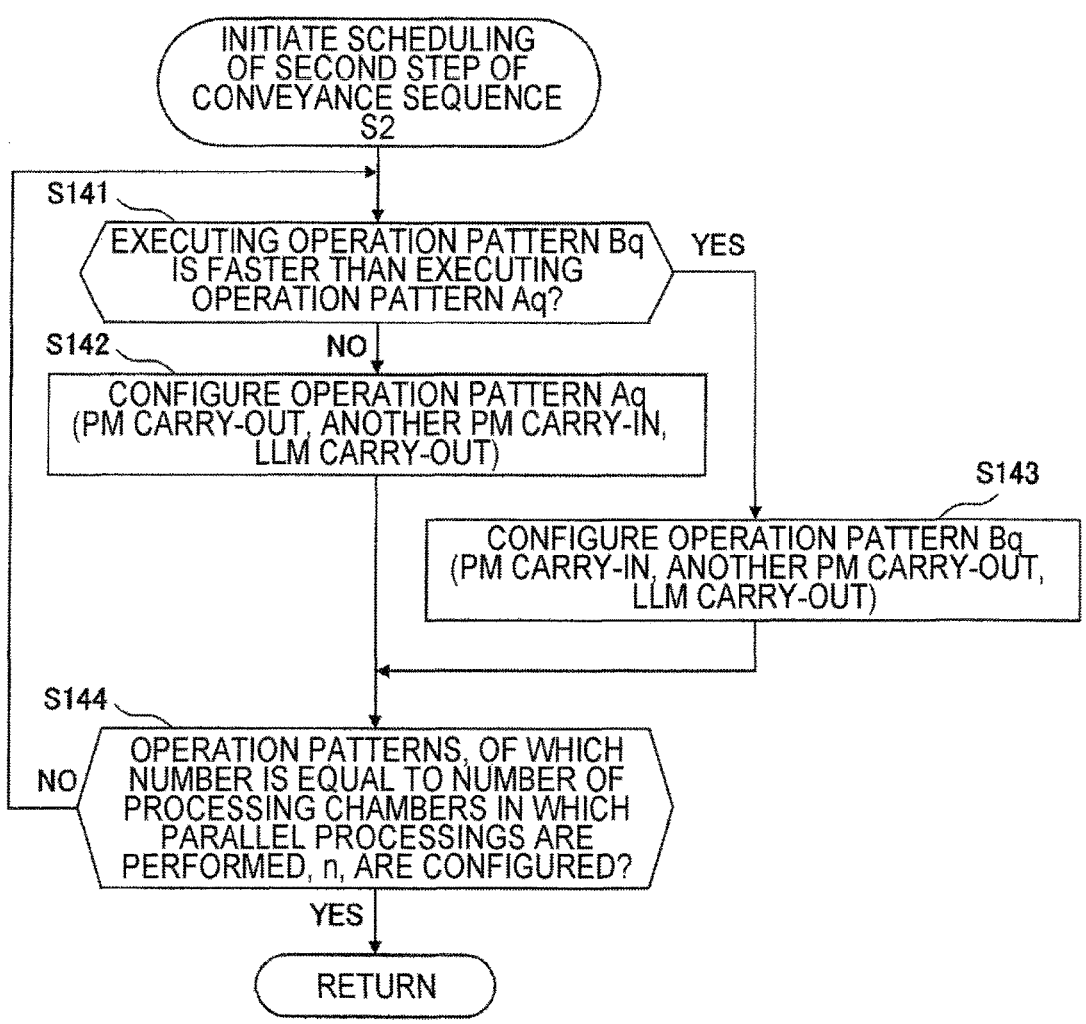
FIG. 12 is a flowchart illustrating a sub-routine concerning the scheduling of the second step of the conveyance sequence S2 illustrated in FIG. 9.

In the scheduling of the second step, in the step S141 illustrated in FIG. 12, the control unit 300 determines first whether executing the operation pattern $B_q$ is faster than executing the operation pattern $A_q$. In addition, when it is determined in step S141 that the throughput obtained by executing the operation pattern $A_q$ is faster, in step S142, the operation pattern $A_q$ is configured (e.g., t9 to t14 FIG. 6A).

For example, in the case where the process processing time is short as illustrated in FIG. 6A, the throughput obtained by executing the operation pattern $A_q$ becomes faster frequently, as compared to the case where the process processing time is long as illustrated in FIG. 6B. Therefore, the operation pattern $A_q$ may be successively configured (e.g., t9 to t22 of FIG. 6A). Thus, with this scheduling, the conveyance arm device 150 may be controlled such that the throughput becomes faster.

In addition, in step S141, when it is determined that the throughput is equal regardless of which one of the operation patterns $A_q$ and $B_q$ is executed, the operation pattern $A_q$ is also configured in step S142. As a result, the operation pattern $A_q$ may be preferentially configured.

Whereas, in step S141, when it is determined that the throughput obtained by executing the operation pattern $B_q$ is faster than that obtained by executing the operation pattern $A_q$, the operation pattern $B_q$ is configured in step S143 (e.g., t9 to t15 of FIG. 6B). This is effective in the following case. For example, in a case where the process processing time is long, the throughput obtained by configuring the operation pattern Bq becomes faster occasionally.

In addition, in step S144, it is determined whether the operation patterns, of which the number is equal to the number of the processing chambers in which the parallel processings are performed, that is, the operation patterns corresponding to one cycle are configured. When it is determined that the operation patterns corresponding to one cycle are not yet configured, the processing returns to the processing of step S141, and when it is determined that the operation patterns corresponding to one cycle are configured, the processing returns to the processing of FIG. 9 and in step S150 moves to the scheduling of the third step.

Figure 13:
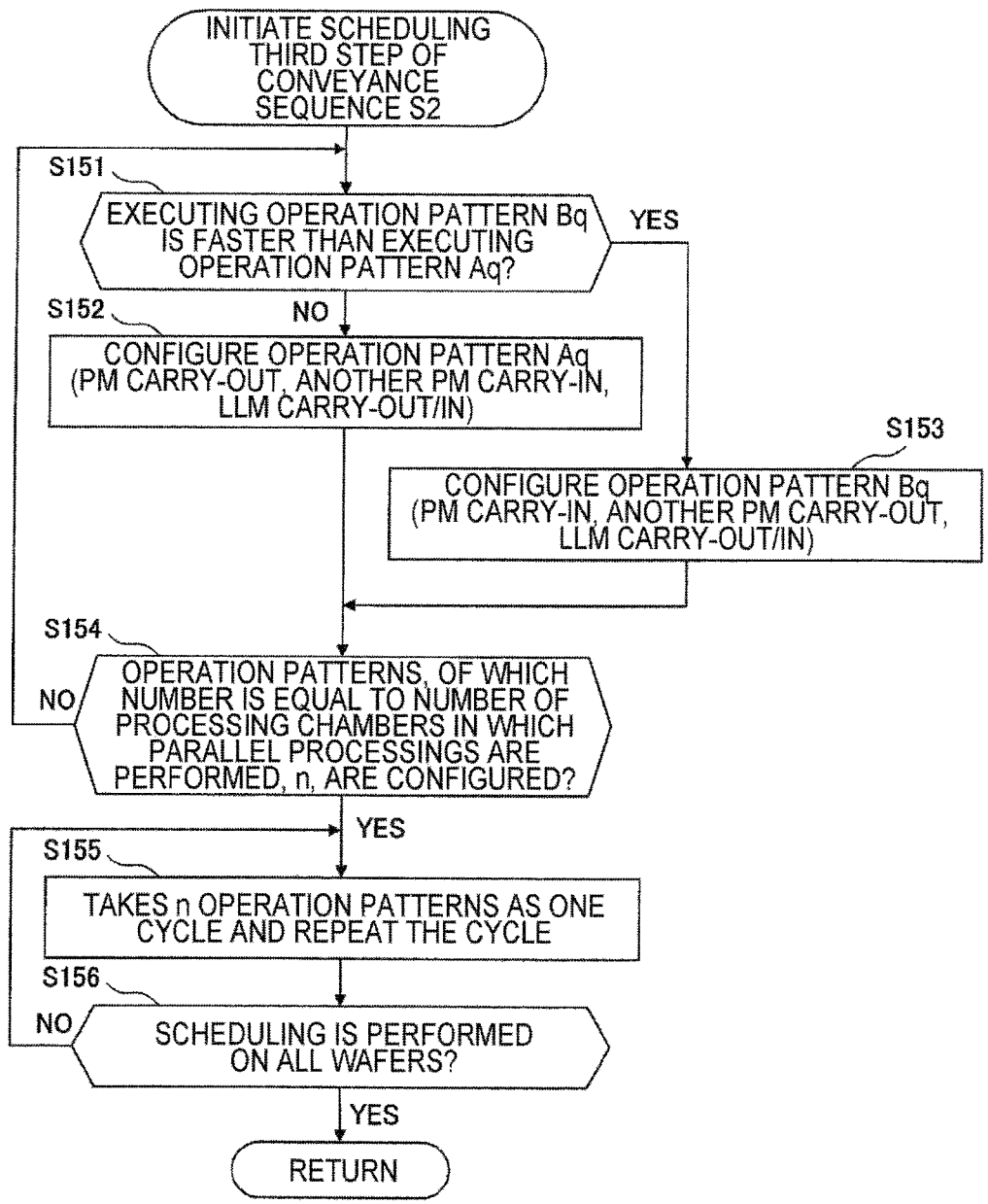
FIG. 13 is a flowchart illustrating a sub-routine concerning the scheduling of the third step of the conveyance sequence S2 illustrated in FIG. 9.

In the next third step, the operation patterns corresponding to one cycle are configured (e.g., t22 to t34 of FIG. 6A), a regular conveyance sequence may be scheduled by repeating the cycle. Here, the operation patterns $A_q$ and $B_q$ of the conveyance sequence S2 are used as the operation patterns similarly to the case of the second step. A flowchart in a case where the control unit 300 performs the scheduling of the third step is illustrated in FIG. 13.

In the scheduling of the third step, the initial one cycle is scheduled similarly to the case of the second step. Accordingly, steps S151 to S154 of FIG. 13 are the same as steps S141 to 144 of FIG. 12 and thus the detailed description thereof will be omitted.

In addition, when the operation patterns corresponding to one cycle are configured, in the next step S155, scheduling is performed to repeat the cycle. Then, in step S156, it is determined whether scheduling for all the wafers W to be subjected to process processings is terminated. Thereafter, in step S156, when it is determined that the scheduling for all the wafers W is terminated, the scheduling of the conveyance sequence S2 is terminated. Then, returning to the processing of FIG. 9, the wafer W conveyance control in the next steps S210 to 260 is performed.

Next, descriptions will be made on a case where the conveyance-sequence category selected in step S120 is the conveyance-sequence S3. In this case, first, the scheduling of the first step is performed in S160 (e.g., t0 to t6 of FIG. 7A). Here, since the parallel processings are performed in three processing cambers PM1, PM2 and PM3, in the first step herein, the operation patterns $A_s$ and $B_s$ of the above-described conveyance sequence S3 are combined to establish a predetermined wafer W arrangement pattern (form) as illustrated in FIG. 4A described above. A flowchart in a case where the control unit 300 performs the scheduling of the first step is illustrated in FIG. 14.

Figure 14:
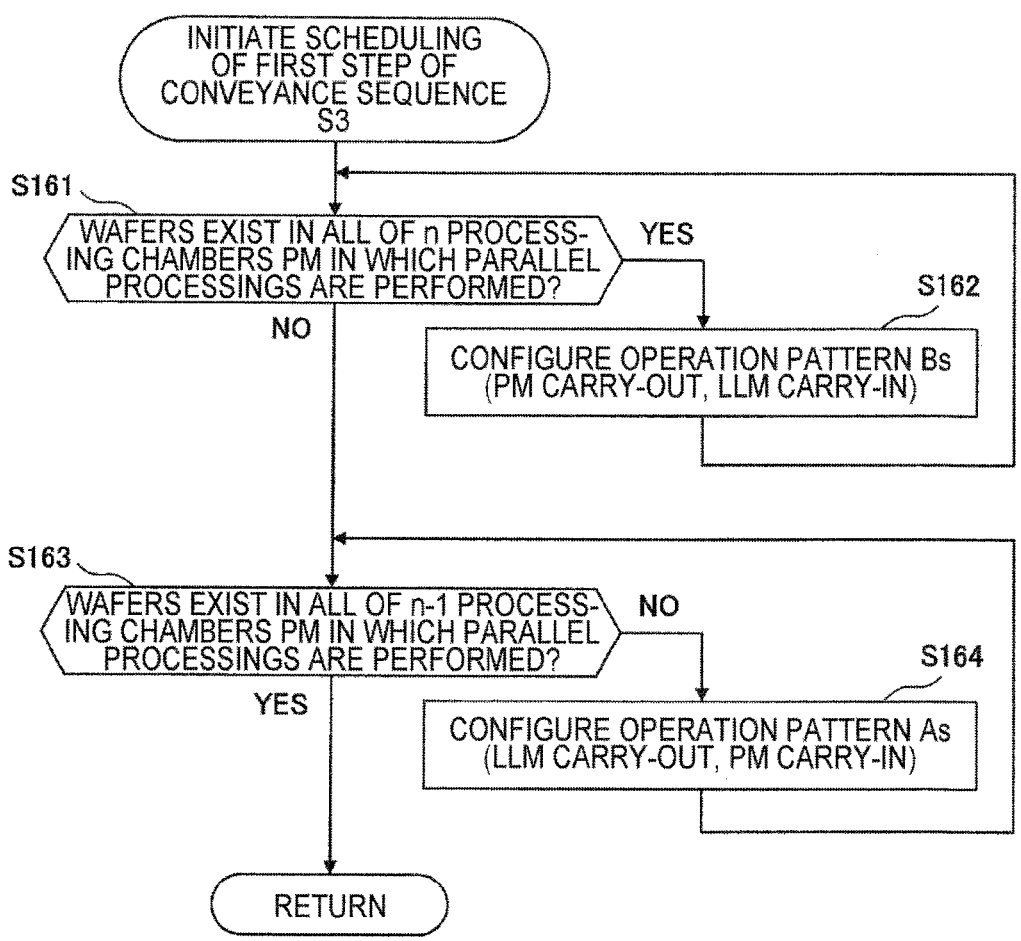
FIG. 14 is a flowchart illustrating a sub-routine concerning the scheduling of the first step of the conveyance sequence S3 illustrated in FIG. 9.

In the scheduling of the first step, the control unit 300 determines, in step S161 illustrated in FIG. 14, whether wafers W exist in all of n (here, three) processing chambers PM1, PM2, PM3 in which the parallel processings are performed, at the moment when the first wafer W is loaded in the load-lock chamber. In step S161, when it is determined that wafers W exist in all the processing chambers in which the parallel processings are performed, the operation pattern $B_s$ is configured in step S162. This is because, in this case, the above-described wafer W arrangement pattern cannot be established unless the parallel processings are initiated from a processing of carrying out a wafer W from any processing chamber.

Whereas, when it is determined in step S161 that there is an empty processing chamber in which no wafer W exists among the processing chambers in which the parallel processings are performed, it is determined in step S163 whether wafers exist in all of n−1 processing chambers, that is, whether there is only one empty processing chamber in which no wafer W exists among the processing chambers in which the parallel processings are performed. When it is determined in step S163 that the number of empty processing chambers is not only one, the operation pattern $A_s$ is configured in step S164 and the process returns to the processing of step S163. Then, the processings of steps S163 and S164 are repeated until the number of empty processing chambers becomes only one so as to configure the operation pattern $A_s$ (e.g., t0 to t6 in FIG. 7A). As a result, scheduling is performed to establish the wafer W arrangement pattern illustrated in FIG. 4A.

Figure 15:
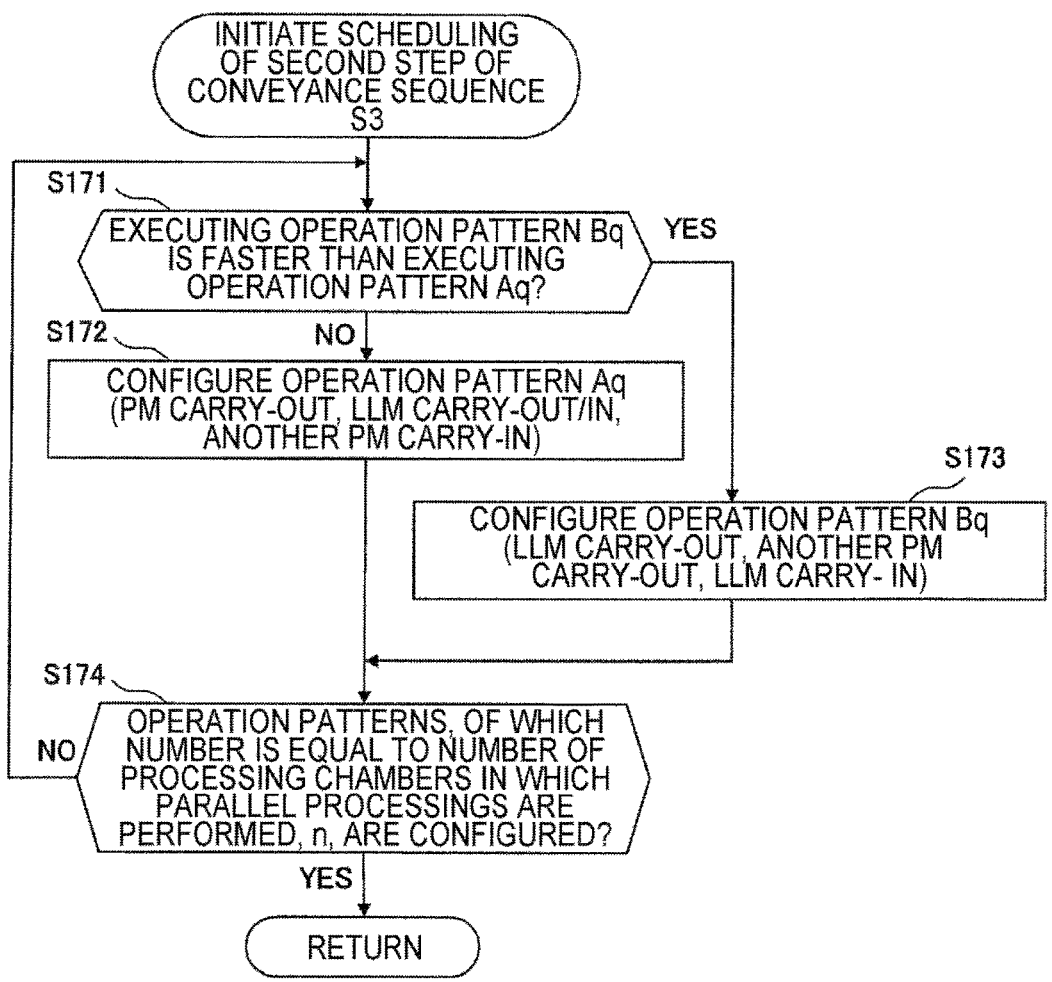
FIG. 15 is a flowchart illustrating a sub-routine concerning the scheduling of the second step of the conveyance sequence S3 illustrated in FIG. 9.

Subsequently, returning to the processing of FIG. 9, the scheduling of the second step is performed in step S170 (e.g., t6 to t19 of FIG. 7A). In the second step, operation patterns corresponding to one cycle are configured to be connected to the third step. As the operation patterns, the operation patterns $A_q$ and $B_q$ of the above-described conveyance sequence S3 are used. A flowchart in a case where the control unit 300 performs the scheduling of the second step is illustrated in FIG. 15.

In the scheduling of the second step, the control unit 300 determines in step S171 whether the throughput obtained by executing the operation pattern $B_q$ is faster than that obtained by executing the operation pattern $A_q$. In addition, when it is determined in step S171 that the throughput is faster when the operation pattern Aq is executed, the operation pattern $A_q$ is configured in step S172 (e.g., t6 to t11 of FIG. 7A).

For example, in the case where the process processing time is short as illustrated in FIG. 7A, the throughput becomes faster frequently when the operation pattern $A_q$ is executed, as compared to the case where the process processing time is long as illustrated in FIG. 7B. Thus, the operation pattern $A_q$ may be successively configured (e.g., t6 to t19 of FIG. 7A). For this reason, with this scheduling, the conveyance arm device 150 may be controlled such that the throughput becomes faster.

In addition, when it is determined in step S171 that the throughput is equal regardless of which one of the operation patterns $A_q$ and $B_q$ is executed, the operation pattern $A_q$ is configured in step S172. As a result, the operation pattern $A_q$ may be preferentially configured.

Whereas, when it is determined in step S171 that the throughput obtained by executing the operation pattern $B_q$ is faster than that obtained by executing the operation pattern $A_q$, the operation pattern $B_q$ is configured in step S173 (e.g., t6 to t14 in FIG. 7A). This is effective in the following case. For example, when the process processing time is long, the throughput may become faster in some cases when the operation pattern $B_q$ is configured.

In addition, in step S174, it is determined whether operation patterns of which the number is equal to the number of processing chambers in which the parallel processings are performed, n, i.e. the operation patterns corresponding to one cycle, are configured. When it is determined that the operation patterns corresponding to one cycle are not yet configured, the process returns to step S171, and when it is determined that the operation patterns corresponding to one cycle are configured, the process returns to the processing of FIG. 9 and moves to the scheduling of the third step in step S180.

Figure 16:
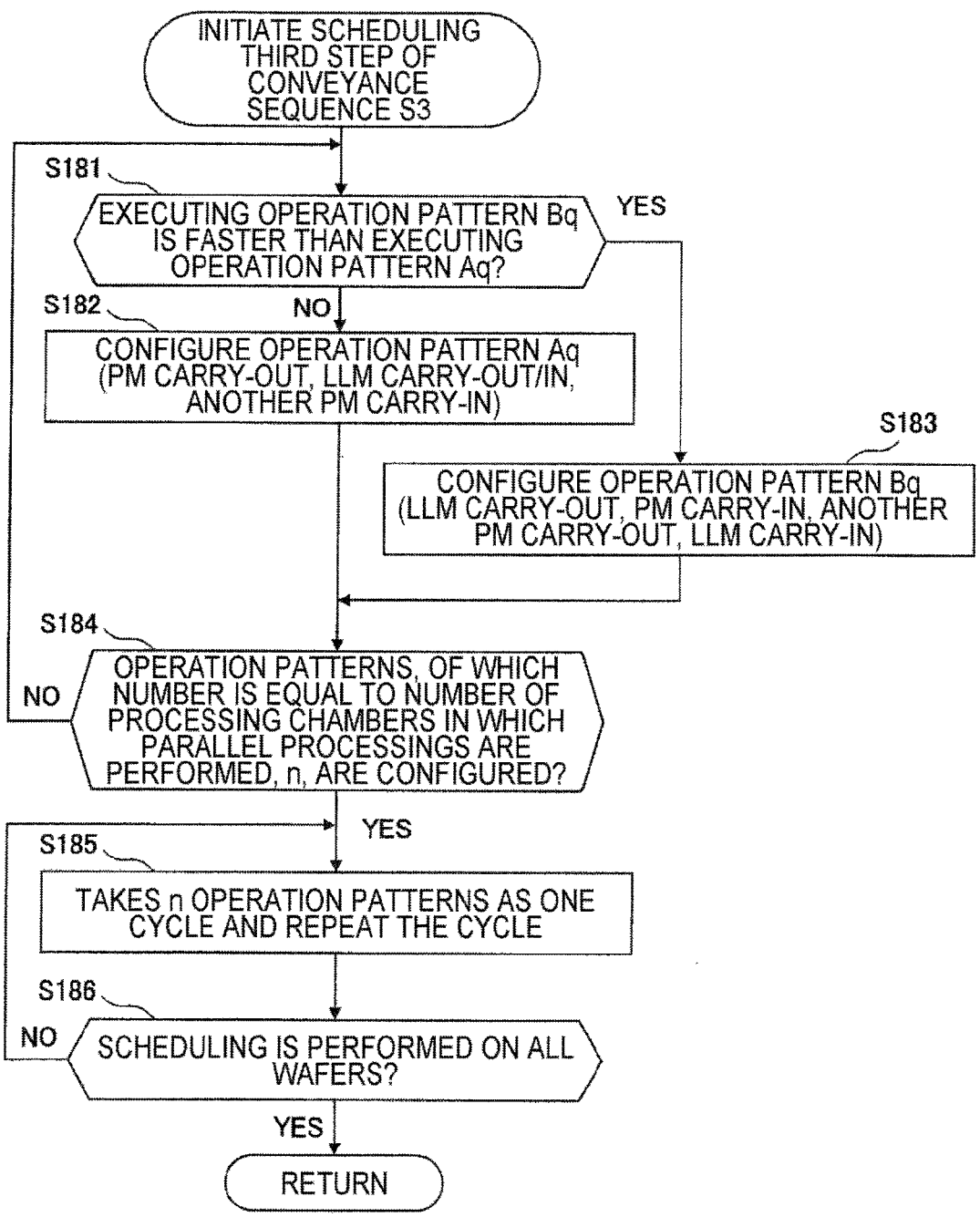
FIG. 16 is a flowchart illustrating a sub-routine concerning the scheduling of the third step of the conveyance sequence S3 illustrated in FIG. 9.

In the next third step, the operation patterns corresponding to one cycle are configured (e.g., t19 to t31 of FIG. 7A) and the cycle is repeated so that regular conveyance sequences may be scheduled. As the operation patterns, the operation patterns $A_q$ and $B_q$ of the conveyance sequence S3 are used similarly to the second step. A flowchart in a case where the control unit 300 performs the scheduling of the third step is illustrated in FIG. 16.

In the scheduling of the third step, the initial one cycle is scheduled similarly to that in the second step. Accordingly, since steps S181 to S184 in FIG. 16 are the same as steps S171 to S174 of FIG. 15 in the case of the second step, the detailed descriptions thereof will be omitted.

In addition, when the operation patterns corresponding to one cycle are configured, in the next step S185, scheduling is performed to repeat the cycle. Then, it is determined in step S186 whether scheduling for all the wafers W to be subjected to process processings is terminated. In addition, when it is determined in step S186 that the scheduling for all the wafers W is terminated, the scheduling of the conveyance sequence S3 is terminated. Then, the process returns to the processing of FIG. 9, and the wafer W conveyance control in the next steps S210 to 236 is performed.

As described above, at the timing when a wafer W is loaded in the load-lock chamber LLM, the selection of conveyance-sequence categories (step S110) and the scheduling (steps S130 to S150, steps S160 to 180) are immediately performed. Thereafter, the control unit 300 controls the conveyance arm device 150 in steps S210 to 236 according to the conveyance sequence S2 or S3 after the scheduling so as to execute a wafer W conveyance control.

Hereinafter, the wafer W conveyance control will be described with reference to FIG. 9. As to the wafer W conveyance control, the first step (steps S210 to S214), the second step (steps S220 to S224), and the third steps (steps S230 to S236) are also executed in this order as in the scheduled conveyance sequence. In addition, in the third step, when processings corresponding to one cycle are performed in steps S230 to S236, one cycle is repeatedly performed until all the wafer W processings are terminated in step S236.

When a process processing such as, for example, etching is continuously performed on a wafer W in each of the processing chambers, a situation in the processing chambers is gradually changed since extraneous matter is adhered within the processing chambers. Therefore, even if the same processing conditions such as, for example, the process processing time and the cleaning processing time are repeated, the processing results such as, for example, an etching amount, tend to be varied over time. In this case, when a control of determining the time of process termination or cleaning termination is performed while detecting, for example, a state of plasma or a gas component, during the wafer W process processing, the process processing time or the cleaning processing time may be varied in some cases.

In addition, when the conveyance arm device carries a wafer W from the inside of a processing chamber, it is necessary to release the wafer W from a mounting table. At this time, when the wafer W is attracted and held on the mounting table by, for example, an electrostatic chuck, the release may become more difficult over time during repetition of attachment/detachment so that the wafer carry-out time may be increased. For this reason, the wafer W carry-out time may be varied over time in some cases.

When a processing time within a processing chamber or a conveyance time by a conveyance arm is varied over time, for example, when the process processing time is considerably changed or the wafer release time is increased, the timing of carry-out or carry-in of a wafer in relation to each chamber may be deviated so that the conveyance sequence may collapse. For example, even if the conveyance arm device 150 may be controlled as it is scheduled, a wafer W may not be carried out at that timing and as a result, the conveyance sequence may be in a state where the conveyance efficiency is degraded.

Accordingly, in the present exemplary embodiment, when the conveyance control based on steps S210 to S236 as illustrated in FIG. 9 is performed, it is determined, in each of steps S212, S222 and S232, whether the conveyance sequence is in the state where the conveyance efficiency is degraded as described above, and when it is determined that the conveyance sequence is in that state, the process returns to step S110 so that the conveyance-sequence categories may be selected and scheduled again. As a result, even if there is a variation over time in the processing time in the processing chambers or in the conveyance time by the conveyance arm, optimum conveyance sequences may be scheduled.

In addition, processing conditions such as, for example, a process processing time and a cleaning processing time may be gradually adjusted. In addition, when maintenance is performed, the conditions within the processing chambers may be improved at once. Thus, the processing conditions such as, for example, the process processing time and the cleaning processing time may be greatly adjusted. Even in such a case, the state in which the conveyance efficiency is degraded is determined in steps S212, S222 and S232 illustrated in FIG. 9 so as to schedule optimum conveyance sequences as described above.

Figure 17:
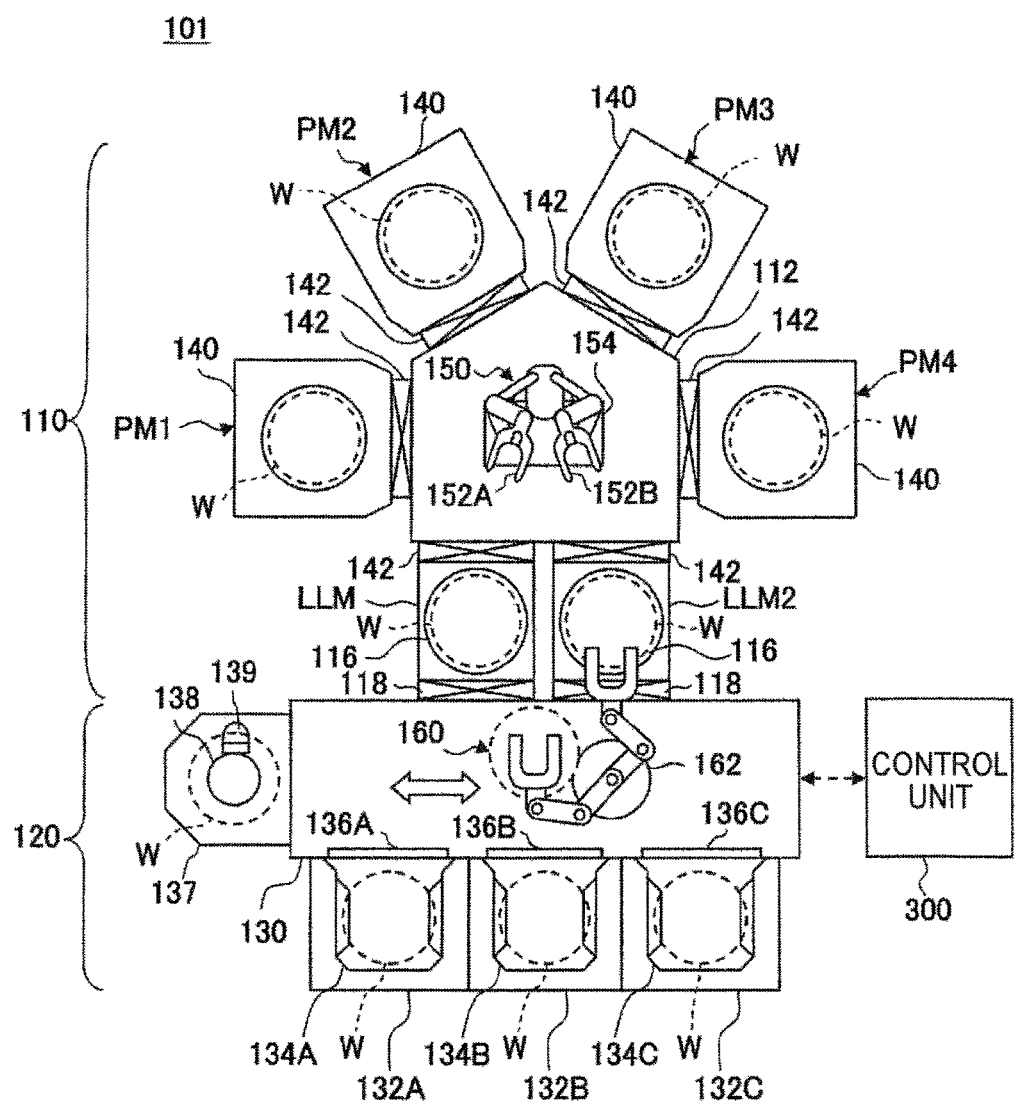
FIG. 17 is a cross-sectional view illustrating an exemplary configuration of another substrate conveyance device in the exemplary embodiment.

In the present exemplary embodiment described above, a case in which the conveyance arm device 150 is applied to a substrate conveyance device configured to slide within the common conveyance chamber 112 to access all the processing chamber have been described as an example. However, without being limited to this, four processing chambers PM1 to PM4 may be provided around the common conveyance chamber 112 as illustrated in FIG. 17 and the conveyance arm device 150 may be applied to a substrate conveyance device 101 which is configured to access each of the processing chambers PM1 to PM4 by being rotated rather than being slid. In addition, the number of processing chambers is not limited to those illustrated in FIGS. 1 and 17.

Although exemplary embodiments of the present disclosure have been described with reference to the accompanying drawings, it is needless to say that the present disclosure is not limited to the exemplary embodiments. It is obvious that a person ordinarily skilled in the art may conceive various changes or modifications within the scope defined in the claims and it is understood that the changes or modifications naturally belong to the technical scope of the present disclosure.

INDUSTRIAL APPLICABILITY

The present disclosure is applicable to a substrate conveyance method and a substrate conveyance device which convey substrates to a plurality of processing chambers in which a process processing is performed on a substrate, using a conveyance arm device.

DESCRIPTION OF SYMBOLS 100, 101: substrate conveyance device, 110: processing unit, 112: common conveyance chamber, 116: delivery table, 120: conveyance unit, 130: conveyance chamber, 132A to 132C: cassette mounting table, 134A to 134C: cassette container, 136A to 136C: load port, 137: orienter, 138: rotary mounting table, 139: optical sensor, 140: processing container, 142: each gate valve, 150: processing unit side conveyance arm device, 152A, 152B: conveyance arm, 154: base, 156: guide rail, 158: flexible arm, 160: conveyance unit side conveyance arm device, 162: base, 300: control unit, 310: operating unit, 320: storage unit, $A_q$, $B_q$: operation pattern, $A_s$, $B_s$, $C_s$: operation pattern, LLM: load-lock chamber, PM1 to PM6: processing chamber, S1, S2, S3: conveyance-sequence category, Tc: cleaning processing time, Tp: process processing time, W: wafer

What is claimed is:

1. A substrate conveyance method of a substrate conveyance device which is provided with a plurality of processing chambers, in each of which a process processing performed by carrying a substrate therein and a cleaning processing performed after the process processing by carrying out the substrate therefrom are repeatedly executed, a load-lock chamber configured to load or unload the substrate, and a conveyance arm device configured to perform carry-out/in between each processing chamber and the load-lock chamber, wherein the substrate conveyance device includes a storage unit configured to store conveyance-sequence categories which operate the conveyance arm device configured to be operated during the cleaning processing per a number of steps of the conveyance arm device, the storage unit being configured to store a plurality of operation patterns of the conveyance arm device in association with each of the conveyance-sequence categories, and wherein the substrate conveyance method comprises:

selecting a conveyance-sequence category among the conveyance-sequence categories based on a processing condition including a process processing time, a cleaning processing time, and a substrate carry-out/in time of the first substrate when the first substrate is loaded in the load-lock chamber when a plurality of substrates is processed in parallel by the plurality of processing chambers, respectively;

scheduling a conveyance sequence by selecting operation patterns associated with the selected conveyance category among the plurality of operation patterns of the conveyance arm device which are stored in the storage unit, and combining the selected operation patterns in such a manner of selecting a next pattern according to a conveyance state estimated from an operation pattern configured immediately before the next operation pattern; and controlling the conveyance arm device according to the scheduled conveyance sequence to perform a conveyance control of the substrate.

2. The substrate conveyance method of claim 1, wherein, in selecting the conveyance-sequence category, a conveyance-sequence category, which causes an operation time required per one substrate to be shortest when the plurality of substrates are processed in the plurality of processing chambers, is selected based on a combination of operating times including the process processing time of the substrate, the cleaning processing time of a processing chamber, the carry-out/in time in the process processing time, and the carry-out/in time during the cleaning processing time.

3. The substrate conveyance method of claim 1, wherein the scheduling of the conveyance sequence is divided into a first step, a second step, and a third step, and wherein in the first step, a predetermined substrate arrangement pattern required for configure a regular conveyance sequence is configured and taken as an initial state, and in the second and third steps, the operation patterns, of which the number is equal to the number of processing chambers in which parallel processings are performed, are combined and taken as one cycle, and the conveyance sequence is configured to repeat the one cycle.

4. The substrate conveyance method of claim 3, wherein, in performing the substrate conveyance control based on the scheduled conveyance sequence, the substrate conveyance processing is performed while controlling the conveyance arm device in the order of the scheduled first step, second step and third step, and in the third step, the operation patterns for the one cycle are repeated.

5. The substrate conveyance method of claim 4, wherein, in performing the substrate conveyance control based on the scheduled conveyance sequence, it is determined whether the conveyance sequence is in a state where a conveyance efficiency is degraded in each step, and when it is determined that the conveyance sequence is in the state, a conveyance-sequence category is selected again and scheduling is performed again.

6. The substrate conveyance method of claim 4, wherein, in performing the substrate conveyance control based on the scheduled conveyance sequence, when switching to a substrate processing in which an operation including the process processing time and an operation time is varied is performed, a conveyance-sequence category is selected again and scheduling is performed again when a first substrate of the switching is loaded in the load-lock chamber.

7. A substrate conveyance device comprising:

a plurality of processing chambers, in each of which a process processing performed by carrying a substrate therein and a cleaning processing performed after the process processing by carrying out the substrate therefrom are repeatedly executed;

a load-lock chamber configured to load or unload the substrate;

a conveyance arm device configured to perform carry-out/in between each processing chamber and the load-lock chamber;

a storage unit configured to store conveyance-sequence categories which operate the conveyance arm device configured to be operated during the cleaning processing per a number of steps of the conveyance arm device, the storage unit being configured to store a plurality of operation patterns of the conveyance arm device in association with each of the conveyance-sequence categories; and a control unit configured to execute processes of:

selecting a conveyance-sequence category among the conveyance-sequence categories based on a processing condition including a process processing time, a cleaning processing time and a substrate carry-out/in time of a first substrate when the first substrate is loaded in the load-lock chamber when a plurality of substrates are processed in parallel by the plurality of processing chambers, respectively;

scheduling a conveyance sequence by selecting operation patterns associated with the selected conveyance category among the plurality of operation patterns of the conveyance arm device stored in the storage unit, and combining the selected operation patterns in such a manner of selecting a next pattern according to a conveyance state estimated from an operation pattern configured immediately before the next operation pattern; and controlling the conveyance arm device according to the scheduled conveyance sequence to perform a conveyance control of the substrate.

* * * * *